US009354846B2

(12) United States Patent
Zhang et al.

(10) Patent No.: US 9,354,846 B2
(45) Date of Patent: May 31, 2016

(54) BIDOMAIN SIMULATOR

(71) Applicant: The MathWorks, Inc., Natick, MA (US)

(72) Inventors: Fu Zhang, Sherborn, MA (US); Zhi Han, Acton, MA (US); Murali K. Yeddanapudi, Watertown, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 887 days.

(21) Appl. No.: 13/652,174

(22) Filed: Oct. 15, 2012

(65) Prior Publication Data

US 2013/0116987 A1 May 9, 2013

Related U.S. Application Data

(63) Continuation-in-part of application No. 13/291,899, filed on Nov. 8, 2011, now Pat. No. 8,914,262, and a continuation-in-part of application No. 13/291,907, filed on Nov. 8, 2011, now Pat. No. 8,935,137.

(51) Int. Cl.

*G06F 17/50* (2006.01)
*G06F 9/44* (2006.01)
*G06F 9/45* (2006.01)

(52) U.S. Cl.

CPC .. *G06F 8/10* (2013.01); *G06F 8/40* (2013.01); *G06F 17/5009* (2013.01)

(58) Field of Classification Search

USPC ............ 703/2, 13, 18; 714/732; 717/105, 168
See application file for complete search history.

(56) References Cited

U.S. PATENT DOCUMENTS

| | | | | |
|---|---|---|---|---|
| 6,226,789 | B1 * | 5/2001 | Tye | G06F 8/52 717/138 |
| 7,904,280 | B2 | 3/2011 | Wood | |
| 8,156,147 | B1 * | 4/2012 | Tocci | G06F 17/504 703/3 |
| 2007/0043992 | A1 * | 2/2007 | Stevenson | G06F 8/20 714/732 |
| 2007/0083347 | A1 | 4/2007 | Bollobas et al. | |
| 2007/0157162 | A1 | 7/2007 | Ciolfi | |
| 2008/0059739 | A1 | 3/2008 | Ciolfi et al. | |
| 2009/0012754 | A1 | 1/2009 | Mosterman et al. | |
| 2009/0228250 | A1 | 9/2009 | Phillips | |

(Continued)

OTHER PUBLICATIONS

Bang Jensen et al., "Digraphs Theory, Algorithms and Applications", Aug. 2007, 772 pages.

(Continued)

*Primary Examiner* — Thai Phan
(74) *Attorney, Agent, or Firm* — Harrity & Harrity, LLP

(57) ABSTRACT

A method, performed by a computer device, may include selecting one or more input and output points in an executable graphical model in a modeling application and simulating the executable graphical model over a plurality of time points. The method may further include generating a time domain response plot for the executable graphical model based on the simulating; obtaining matrices of partial derivatives based no the selected one or more input and output points at particular time points of the plurality of time points; generating a frequency domain response plot for the executable graphical model based on the obtained matrices of partial derivatives; and generating a bidomain simulator user interface, the bidomain simulator user interface including the generated time domain response plot and the generated frequency domain response plot.

33 Claims, 14 Drawing Sheets

(56) References Cited

U.S. PATENT DOCUMENTS

| | | | |
|---|---|---|---|
| 2009/0235252 A1 | 9/2009 | Weber et al. | |
| 2010/0017179 A1 | 1/2010 | Wasynczuk et al. | |
| 2010/0057651 A1 | 3/2010 | Fung et al. | |
| 2010/0228693 A1 | 9/2010 | Dawson et al. | |
| 2010/0262568 A1 | 10/2010 | Schwaighofer et al. | |
| 2011/0137632 A1 | 6/2011 | Paxson et al. | |
| 2012/0023477 A1 * | 1/2012 | Stevenson | G06F 8/20 717/105 |
| 2013/0116986 A1 | 5/2013 | Zhang et al. | |
| 2013/0116988 A1 | 5/2013 | Zhang et al. | |
| 2013/0116989 A1 | 5/2013 | Zhang et al. | |
| 2013/0198713 A1 | 8/2013 | Zhang et al. | |

OTHER PUBLICATIONS

Bauer, “Computational Graphs and Rounding Error”, SIAM Journal on Numerical Analysis, vol. 11 No. 1, Mar. 1974, 10 pages.

Griewank, et al., “Evaluating Derivatives: Principles and Techniques of Algorithmic Differentiation”, 2008, 458 pages.

Sezer et al., “Nested Epsilon Decompositions of Linear Systems: Weakly Coupled and Overlapping Blocks”, Proceedings of the 1990 Bilkent Conference on New Trends in Communication, Control and Signal Processing, vol. 1, (1990), 13 pages.

Zecevic et al., “Control of Complex Systems—Decompositions of Large-Scale Systems”, Chapter 1, Communications and Control Engineering, (2010) 27 pages.

Henzinger, “The Theory of Hybrid Automata”, Proceedings of the 11th Symposium on Logic in Computer Science (LICS ’96) 1996, 30 pages.

Paliwal et al., “State Space Modeling of a Series Compensated Long Distance Transmission System through Graph Theoretic Approach”, IEEE, 1978, 10 pages.

Ilic et al., “A Simple Structural Approach to Modeling and Analysis of the Inter-area Dynamics of the Large Electric Power Systems: Part I—Linearized Models of Frequency Dynamics”, 1993 North American Power Symposium, Oct. 11-12, 1993, pp. 560-569.

Ilic et al., “A Simple Structural Approach to Modeling and Analysis of the Inter-area Dynamics of the Large Electric Power Systems: Part II—Nonlinear Models of Frequency and Voltage Dynamics”, Oct. 11-12, 1993, pp. 570-578.

International Search Report and Written Opinion dated Jan. 31, 2013 issued in corresponding PCT application No. PCT/I/US2012/063223, 9 pages.

Hiskens, Ian A. and Pai, M.A. “Trajectory Sensitivity Analysis of Hybrid Systems.” IEEE Transactions on Circuits and Systems—Part I: Fundamental Theory and Applications, vol. 47, No. 2, Feb. 2000, pp. 204-220.

Hiskens, Ian A. and Pai, M.A. “Power System Applications of Trajectory Sensitivities.” IEEE, 2002, pp. 1-6.

Nguyen, Tony B., Pai, M.A, and Hiskens, I.A. “Computation of Critical Values of Parameters in Power Systems Using Trajectory Sensitivities.” 14th PSCC, Sevilla, Jun. 24, 2002, Session 39, Paper 5, pp. 1-6.

Donze, Alexandre and Maler, Oded. “Systematic Simulation using Sensitivity Analysis.” Verimag, Gieres, France, pp. 1-16.

Masse, J. “Diffedge: Differentiation, sensitivity analysis and idenfication of hybrid Models.” Appedge, Consulting & Engineering, pp. 1-9.

Serban, Radu and Hindmarsh, Alan C. “CVODES: An ODE Solver with Sensitivity Analysis Capabilities.” ACM Transactions on Mathematical Software, vol. V, No. N, Sep. 2003, pp. 1-22.

Griewank, Andreas. “A mathematical view of automatic differentiation.” Acta Numerica, 2003, pp. 1-78.

Griewank, Andreas and Reese, Shawn. “On the Calculation of Jacobian Matrices by the Markowitz Rule.” Mar. 1992, pp. 1-14.

Henzinger, Thomas A. “The Theory of Hybrid Automata.” pp. 1-30.

Zecevic, A.I. and Siljak, D.D. “Design of Robust Static Output Feedback for Large-Scale Systems.” IEEE Transactions on Automatic Control, vol. 49, No. 11, Nov. 2004, pp. 1-5.

Peponides, George M. and Kokotovic, Petar V. “Weak Connections, Time Scales, and Aggregation of Nonlinear Systems.” IEEE Transactions on Automatic Control, vol. AC-28, No. 6, Jun. 1983, pp. 729-735.

Siljak, D.D. “On Stability of Large-Scale Systems under Structural Perturbations.” IEEE Transactions on Systems, Man, and Cybernetics, Jul. 1973, pp. 415-417.

Vidyasagar, M. “Decomposition Techniques for Large-Scale Systems with Nonadditive Interactions: Stability and Stabilizability.” IEEE Transactions on Automatic Control, vol. AC-25, No. 4, Aug. 1980, pp. 773-779.

Co-pending U.S. Appl. No. 13/291,907, entitled “Graphic Theoretic Linearization of Sensitivity Analysis”, by Zhang et al., filed Nov. 8, 2011, 64 pages.

* cited by examiner

BIDOMAIN SIMULATOR

This patent application is a continuation-in-part of U.S. patent application Ser. No. 13/291,899, entitled "VISUALIZATION OF DATA DEPENDENCY IN GRAPHICAL MODELS" and filed on Nov. 8, 2011, which is hereby incorporated by reference in its entirety. This patent application is also a continuation-in-part of U.S. patent application Ser. No. 13/291,907, entitled "GRAPHIC THEORETIC LINEARIZATION AND SENSITIVITY ANALYSIS" and filed on Nov. 8, 2011, which is hereby incorporated by reference in its entirety.

BACKGROUND INFORMATION

A large variety of systems, such as mechanical systems, electrical systems, biological systems, and/or computer systems, may be represented as dynamic systems. Computational tools have been developed to model, simulate, and/or analyze dynamic systems. A computational toot may represent a dynamic system using a graphical model. The graphical model may include blocks that may represent components of the dynamic system. The blocks may be connected to represent relationships between the components. The computational tool may simulate the graphical model and may provide results of the simulation. Generating and representing relevant information about simulation results for a graphical model may be difficult.

DETAILED DESCRIPTION OF PREFERRED EMBODIMENTS

Figure 1:
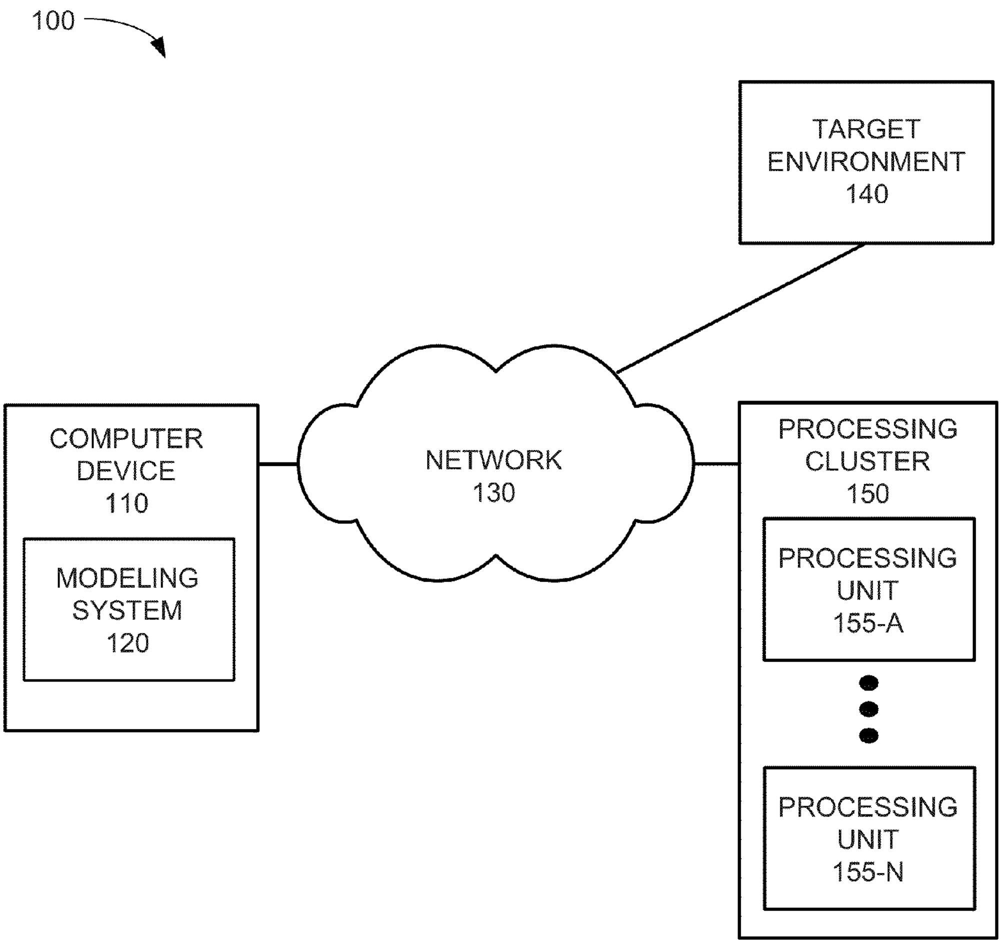
FIG. 1 is a diagram illustrating exemplary components of an environment according to an implementation described herein.

The following detailed description refers to the accompanying drawings. The same reference numbers in different drawings identify the same or similar elements. Also, the following detailed description does not limit the invention.

An implementation described herein relates to a bidomain simulator for a graphical model. A bidomain simulator may provide simulation results for the graphical model in both a time domain and a frequency domain. The bidomain simulator may enable a user to monitor both a time domain response and a frequency domain response for a dynamic system, or a part of a dynamic system, represented by a graphical model during a simulation of the graphical model. The bidomain simulator may enable a user to correlate a particular time domain response point or set of points with a corresponding frequency response curve or set of curves. Furthermore, the bidomain simulator may enable the user to include a source signal, such a frequency response source signal, in a graphical model and may provide a framework to use the source signal as an input in a graphical model.

The frequency domain response may be generated based on a closed loop Jacobian matrix associated with the graphical model. A closed loop Jacobian matrix may be determined as follows. A graphical model may include one or more blocks. A block may be characterized by the following equations:

$$\dot{x}=f(x,u,t)$$

$$y=g(x,u,t) \qquad \text{Equation (1)}$$

In Equation (1), x may represent the states of the block, u may represent inputs to the block, t may represent a time variable, and y may represent outputs of the block. An example of a block that may be associated with a state may be an integrator block. An integrator block may convert a dx/dt signal (that is, a derivative of x with respect to t) to an x signal. The function $f$, also called the derivative function, may characterize the rate of change of the state variables of the block as a function of the states, inputs and time. The variables x, u, and y may be vectors. The function g, also called the output function, may characterize the outputs of the block as a function of the states, inputs, and time. While implementations described herein may be described as continuous-time functions and/or blocks, the implementations described herein may be applied to discrete-time functions and/or blocks, or to combinations of continuous-time and discrete-time functions and/or blocks. For a discrete-time block, the derivative function may be replaced by an update function and the time variable may be replaced by a time delay variable.

A block Jacobian matrix J for a block may be defined as follows:

$$J=\begin{bmatrix}\frac{\partial f}{\partial x} & \frac{\partial f}{\partial u}\\ \frac{\partial g}{\partial x} & \frac{\partial g}{\partial u}\end{bmatrix}=\begin{bmatrix}A & B\\ C & D\end{bmatrix} \qquad \text{Equation (2)}$$

Thus, in the block Jacobian matrix, A may correspond to a matrix that defines the partial derivatives of the derivative function with respect to the states, B may correspond to a matrix that defines the partial derivatives of the derivative function with respect to the inputs, C may correspond to a matrix that defines the partial derivatives of the output function with respect to the states, and D may correspond to a matrix that defines the partial derivatives of the output function with respect to the inputs.

The block Jacobian matrix may be a time varying matrix. In other words, the values of the elements of the block Jacobian matrix may vary with time. For example, assume a block is defined by the following equations:

$$x_1' = x_2^2$$

$$x_2' = x_1 + x_2 \quad \text{Equation (3)}$$

The corresponding A matrix of the block Jacobian matrix may be:

$$A = \begin{bmatrix} 0 & 2x_2 \\ 1 & 1 \end{bmatrix} \quad \text{Equation (4)}$$

A graphical model may include multiple blocks. An open loop Jacobian matrix may be determined for a graphical model by the following process. Block Jacobian matrices may be determined for the blocks included in the graphical model. A block Jacobian matrix for a block may be defined by a user, may be determined analytically from one or more equations that are associated with the block, and/or may be determined numerically using a perturbation algorithm. The block Jacobian matrices associated with individual blocks of the graphical model may be concatenated into a single block Jacobian matrix.

For example, assume a graphical model includes a set of blocks $\{b_i, \ldots, b_n\}$ with a subset of blocks $\{b_{i_i}, \ldots, b_{i_{nx}}\}$ that include internal states. The concatenated block Jacobian matrix, also known as the open loop Jacobian matrix, may be defined as:

$$A_0 = \begin{bmatrix} A_1 & & \\ & \cdots & \\ & & A_{n_x} \end{bmatrix} \quad \text{Equation (5)}$$

$$B_0 = \begin{bmatrix} B_1 & & \\ & \cdots & \\ & & B_{n_x} \end{bmatrix}$$

$$C_0 = \begin{bmatrix} C_1 & & \\ & \cdots & \\ & & C_{n_x} \end{bmatrix}$$

$$D_0 = \begin{bmatrix} D_1 & & \\ & \cdots & \\ & & D_{n_x} \end{bmatrix}$$

An open loop model Jacobian matrix for a graphical model may be defined as:

$$J = (S_{open}, M) = \left( \begin{bmatrix} A_0 & B_0 \\ C_0 & D_0 \end{bmatrix}, M \right) \quad \text{Equation (6)}$$

In Equation (6), M may correspond to the connection matrix. The connection matrix may be determined as follows. A connection between two blocks may correspond to a simple connection. A simple connection may include any connection that does not involve a signal routing block. Since a simple connection establishes a connection between each element of an output variable with dimension n of a first block, $y_1$, and each element of an input variable with dimension n of a second block, $u_2$, the Jacobian matrix of the connection may be defined as follows:

$$\frac{\partial u_2}{\partial y_1} = I_{n \times n} \quad \text{Equation (7)}$$

In Equation (7), I may correspond to the identity matrix. A connection between two blocks may correspond to a signal routing connection. A signal routing connection may involve one or more signal routing blocks, such as a selector block, a bus creator block, a bus selector block, or a demultiplexer block. The signal routing blocks may be, for example, index based (e.g., signal 3 in the input is connected to signal 5 in the output) or name based (e.g., signal 'throttle_angle' of the input is signal 3 in the output). In a signal routing connection, the relationships between the elements of u and y may be described as a mapping between an output of the first block and the input of the second block, as follows:

$$u_j = y_i, \text{ where } (i,j) \in M_{SET},\ u = \Re^d,\ y \in \Re^n, \text{ and } M_{SET} \subseteq \{1, \ldots, d\} \times \{1, \ldots, n\} \quad \text{Equation (8)}$$

In Equation (8), $M_{SET}$ may correspond to a set of binary pairs that represents the connection of each of the individual elements of the signal between the blocks. Thus, the Jacobian matrix of the connection between the output of a first block $b_p$ and the input of a second block $b_q$, may be defined as follows:

$$\frac{\partial u_p}{\partial y_q} = M_{p,q} \equiv [m_{i,j}]_{d \times n}, \quad \text{Equation (9)}$$

$$\text{where } m_{i,j} = \begin{cases} 0, & (i, j) \notin M_{SET} \\ 1, & (i, j) \in M_{SET} \end{cases}$$

If no signal connects the output of $b_p$ with the input of h, then $M_{p,q} = [0]_{dxn}$. The connection matrix M may be generated by concatenating the Jacobian matrices of all the signals in the graphical model, as follows:

$$M = \begin{bmatrix} 0 & M_{1,2} & \cdots & M_{1,n} \\ M_{2,1} & 0 & \cdots & \cdots \\ \cdots & \cdots & 0 & M_{n-1,n} \\ M_{n,1} & \cdots & M_{n,n-1} & 0 \end{bmatrix} \quad \text{Equation (10)}$$

The closed loop Jacobian matrix for a graphical model may be generated by performing a linear fractional transformation on the open loop Jacobian matrix with respect to the connection matrix. Assuming a block matrix S:

$$S = \begin{bmatrix} A & B \\ C & D \end{bmatrix} \in \Re^{(m_1+m_2) \times (n_1+n_2)} \quad \text{Equation (11)}$$

and a matrix $E \in \Re^{n_2 \times m_2}$, a linear fractional transformation of a block matrix S with respect to a matrix E may be defined as:

$$F(S,E) = A + BE(I - DE)^{-1}C \quad \text{Equation (12)}$$

Thus, the closed loop Jacobian matrix $J_{closed}$ may be defined as:

$$J_{closed} = F(S_{open}, M) \quad \text{Equation (13)}$$

The closed loop Jacobian matrix, computed at a particular time point in the simulation of a graphical model, may correspond to the frequency response of the graphical model at the particular time point. For example, the closed loop Jacobian matrix may be used to derive a transfer function between two points in a graphical model specified when determining the closed loop Jacobian matrix. The transfer function may be converted to a frequency response between the two points of the graphical model.

FIG. 1 is a diagram of an exemplary environment 100 according to an implementation described herein. As shown in FIG. 1, environment 100 may include a computer device 110, a network 130, a target environment 140, and a processing cluster 150.

Computer device 110 may include one or more computer devices, such as a personal computer, a workstation, a server device, a blade server, a mainframe, a personal digital assistant (PDA), a laptop, a tablet, or another type of computation or communication device. Computer device 110 may include a modeling system 120. Modeling system 120 may include a development tool (e.g., a software application) that enables creation, modification, design, and/or simulation of graphical models representing dynamic systems. Furthermore, modeling system 120 may enable the generation of executable code based in a graphical model. Modeling system 120 may include a bidomain simulator that may represent a response of a graphical model, based on a simulation, in both a time domain and a frequency domain.

Network 130 may enable computer device 110 to communicate with other components of environment 100, such as target environment 140 and/or processing cluster 150. Network 120 may include one or more wired and/or wireless networks. For example, network 120 may include a cellular network, the Public Land Mobile Network (PLMN), a second generation (26) network, a third generation (36) network, a fourth generation (46) network (e.g., a long term evolution (LTE) network), a fifth generation (SG) network, a code division multiple access (CDMA) network, a global system for mobile communications (GSM) network, a general packet radio services (GPRS) network, a Wi-Fi network, an Ethernet network, a combination of the above networks, and/or another type of wireless network. Additionally, or alternatively, network 120 may include a local area network (LAN), a wide area network (WAN), a metropolitan area network (MAN), an ad hoc network, an intranet, the Internet, a fiber optic-based network (e.g., a fiber optic service network), a satellite network, a television network, and/or a combination of these or other types of networks.

Target environment 140 may include one or more devices that may be associated with a dynamic system that is represented by a graphical model in modeling system 120. For example, target environment 140 may include a set of sensors and/or a set of controllers corresponding to a dynamic system. Modeling system 120 may receive data from target environment 140 and use the received data as input to the graphical model. Furthermore, target environment 140 may receive executable code from modeling system 120. The received executable code may enable target environment 140 to perform one or more operations on the dynamic system associated with target environment 140. Target environment 140 may include, for example, an embedded processing device.

Processing cluster 150 may include processing resources which may be used by modeling system 120 in connection with a graphical model. For example, processing cluster 150 may include processing units 155-A to 155-N (referred to herein collectively as "processing units 155" and individually as "processing unit 155"). Processing units 155 may perform operations on behalf of computer device 110. For example, processing units 155 may perform parallel processing in a graphical model in modeling system 120. Modeling system 120 may provide an operation to be performed to processing cluster 150, processing cluster 150 may divide tasks associated with the operation among processing units 155, processing cluster 150 may receive results of the performed tasks from processing units 155, and may generate a result of the operation and provide the result of the operation to modeling system 120.

In one implementation, processing unit 155 may include a graphic processing unit (GPU). A GPU may include one or more devices that include specialized circuits for performing operations relating to graphics processing (e.g., block image transfer operations, simultaneous per-pixel operations, etc.) and/or for performing a large number of operations in parallel. In another example, processing unit 155 may correspond to a single core of a multi-core processor. In yet another example, processing unit 155 may include a computer device that is part of a cluster of computer devices, e.g., computing devices operating as part of a computing cloud.

Although FIG. 1 shows exemplary components of environment 100, in other implementations, environment 100 may include fewer components, different components, differently arranged components, and/or additional components than those depicted in FIG. 1. Alternatively, or additionally, one or more components of environment 100 may perform one or more tasks described as being performed by one or more other components of environment 100.

Figure 2:
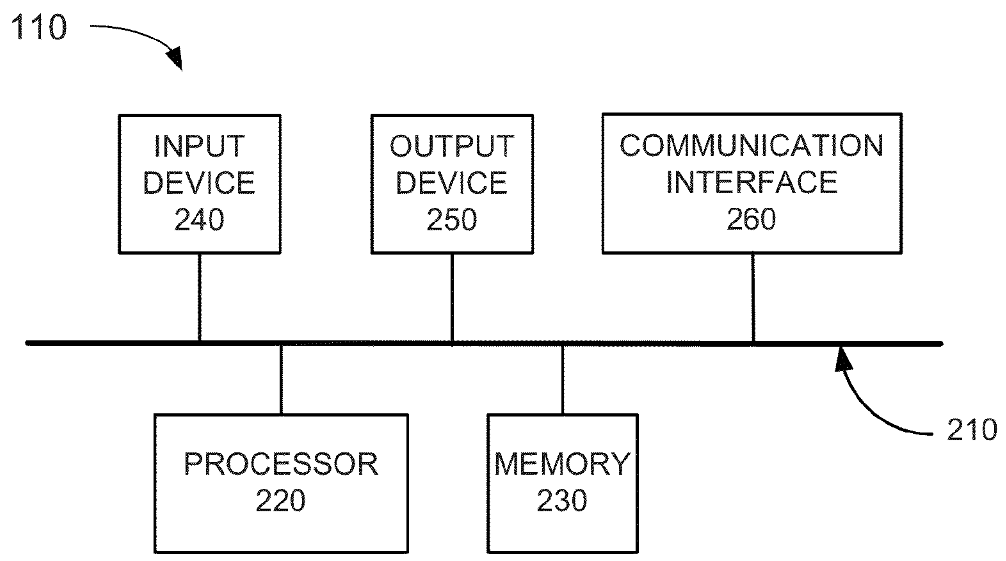
FIG. 2 is a diagram illustrating exemplary components of the computer device of FIG. 1.

FIG. 2 is a diagram illustrating exemplary components of computer device 110 according to a first implementation described herein. As shown in FIG. 2, computer device 110 may include a bus 210, a processor 220, a memory 230, an input device 240, an output device 250, and communication interface 260.

Bus 210 may include a path that permits communication among the components of computer device 200. Processor 220 may include one or more single-core and/or or multi-core processors, microprocessors, and/or processing logic (e.g., application specific integrated circuits (ASICs), field programmable gate arrays (FPGAs), ARM processors, etc.) that may interpret and execute instructions. Memory 230 may include a random access memory (RAM) device or another type of dynamic storage device that may store information and instructions for execution by processor 220, a read only memory (ROM) device or another type of static storage device that may store static information and instructions for use by processor 220, a magnetic and/or optical recording memory device and its corresponding drive, and/or a removable form of memory, such as a flash memory.

Input device 240 may include a mechanism that permits an operator to input information to computer device 110, such as a keypad, a keyboard, a button, or an input jack for an input device such as a keypad or a keyboard, a camera, an analog to digital (ADC) converter, a pulse-width modulation (PWD) input, etc. Output device 250 may include a mechanism that outputs information to the operator, including one or morel ht indicators, a display, a speaker, a digital to analog (DAC) converter, a PWM output, etc.

Communication interface 260 may include a transceiver that enables computer device 110 to communicate with other devices and/or systems. For example, communication interface 260 may include a modem, a network interface card, and/or a wireless interface card.

As will be described in detail below, computer device 110 may perform certain operations relating to a bidomain simulator. Computer device 110 may perform these operations in response to processor 220 executing software instructions stored in a computer-readable medium, such as memory 230. A computer-readable medium may be defined as a non-transitory memory device. A memory device may include memory space within a single physical memory device or spread across multiple physical memory devices.

The software instructions may be read into memory 230 from another computer-readable medium, or from another device via communication interface 260. The software instructions contained in memory 230 may cause processor 220 to perform processes that will be described later. Alternatively, hardwired circuitry may be used in place of or in combination with software instructions to implement processes described herein. Thus, implementations described herein are not limited to any specific combination of hardware circuitry and software.

Although FIG. 2 shows exemplary components of computer device 110, in other implementations, computer device 110 may include fewer components, different components, additional components, or differently arranged components than depicted in FIG. 2. Additionally or alternatively, one or more components of computer device 110 may perform one or more tasks described as being performed by one or more other components of computer device 200.

Figure 3:
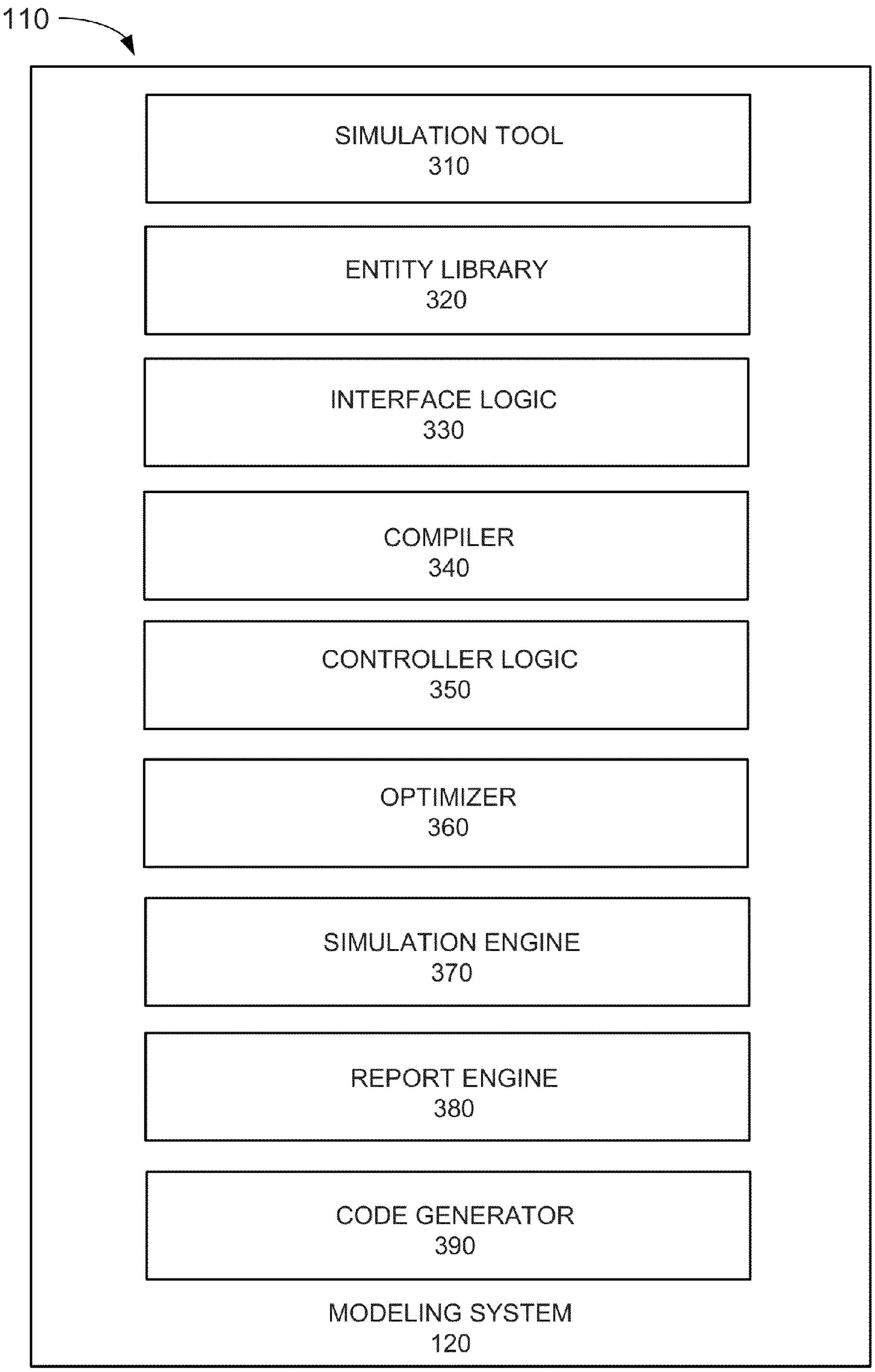
FIG. 3 is a diagram of exemplary components of a modeling system that may be included in the computer device of FIG. 1.

FIG. 3 is a diagram of exemplary components of modeling system 120 that may be included in computer device 110. Modeling system 120 may include a development tool that enables existing software components to be used in the creation of a model and that may enable generation of executable code based on the model. For example, the development tool may include a graphical modeling tool or application that provides a user interface for a numerical computing environment. Additionally, or alternatively, the development tool may include a graphical modeling tool and/or application that provides a user interface for modeling and executing a dynamic system (e.g., based on differential equations, difference equations, algebraic equations, discrete events, discrete states, stochastic relations, etc.).

A dynamic system (either natural or man-made) may be a system whose response at any given time may be a function of its input stimuli, its current state, and a current time. Such systems may range from simple to highly complex systems. Natural dynamic systems may include, for example, a falling body, the rotation of the earth, bio-mechanical systems (muscles, joints, etc.), bio-chemical systems (gene expression, protein pathways), weather, and climate pattern systems, and/or any other natural dynamic system. Man-made or engineered dynamic systems may include, for example, a bouncing ball, a spring with a mass tied on an end, automobiles, airplanes, control systems in major appliances, communication networks, audio signal processing systems, and a financial or stock market, and/or any other man-made or engineered dynamic system.

The system represented by a model may have various execution semantics that may be represented in the model as a collection of modeling entities, often referred to as blocks. A block may generally refer to a portion of functionality that may be used in the model. The block may be represented graphically, textually, and/or stored in some form of internal representation. Also, a particular visual depiction used to represent the block, for example in a graphical block diagram, may be a design choice.

A block may be hierarchical in that the block itself may comprise one or more blocks that make up the block. A block comprising one or more blocks (sub-blocks) may be referred to as a subsystem block. A subsystem block may be configured to represent a subsystem of the overall system represented by the model. A subsystem may be a masked subsystem that is configured to have a logical workspace that contains variables only readable and writeable by elements contained by the subsystem.

A graphical model (e.g., a functional model) may include entities with relationships between the entities, and the relationships and/or the entities may have attributes associated with them. The entities my include model elements such as blocks and/or ports. The relationships may include model elements such as lines (e.g., connector lines) and references. The attributes may include model elements such as value information and meta information for the model element associated with the attributes. A graphical model may be associated with configuration information. The configuration information may include information for the graphical model such as model execution information (e.g., numerical integration schemes, fundamental execution period, etc.), model diagnostic information (e.g., whether an algebraic loop should be considered an error or result in a warning), model optimization information e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to spec constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

In one example, a block may include or otherwise correspond to a non-causal modeling, function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., X=2Y) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

Assigning causality to equations may consist of determining which variable in an equation is computed by using that equation. Assigning causality may be performed by sorting algorithms, such as a Gaussian elimination algorithm. The result of assigning causality may be a lower block triangular matrix that represents the sorted equations with strongly connected components representative of algebraic loops. Assigning causality may be part of model compilation.

Equations may be provided in symbolic form. A set of symbolic equations may be symbolically processed to, for example, produce a simpler form. To illustrate, a system of two equations X=2Y+U and Y=3X−2U may be symbolically processed into one equation 5Y=−U. Symbolic processing of equations may be part of model compilation.

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally describes a directionally consistent signal flow between blocks, in other implementations, the interactions between blocks may not necessarily be directionally specific or consistent.

In an embodiment, connector lines in a model may represent related variables that are shared between two connected blocks. The variables may be related such that their combination may represent power. For example, connector connector lines may represent voltage, and current, power, etc. Additionally, or alternatively, the signal flow between blocks may be automatically derived.

In some implementations, one or more of blocks may so, or alternatively, operate in accordance with one or more rules or policies corresponding to a model in which they are included. For instance, if the model were intended to behave as an actual, physical system or device, such as an electronic circuit, the blocks may be required to operate within, for example, the laws of physics (also referred to herein as "physics-based rules"). These laws of physics may be formulated as differential and/or algebraic equations (e.g., constraints, etc.). The differential equations may include derivatives with respect to time, distance, and/or other quantities, and may be ordinary differential equations (ODEs), partial differential equations (PDEs), and/or differential and algebraic equations (DAEs). Requiring models and/or model components to operate in accordance with such rules or policies may, for example, help ensure that simulations based on such models will operate as intended.

A sample time may be associated with the elements of a graphical model. For example, a graphical model may include a block with a continuous sample time such as a continuous-time integration block that may integrate an input value as time of execution progresses. This integration may be specified by a differential equation. During execution the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Alternatively, or additionally, a graphical model may include a block with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model may include a block with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated a this point in time and before advancing execution time.

Further, the values of attributes of a graphical model may be inferred from other elements of the graphical model or attributes of the graphical model. The inferring may be part of a model compilation. For example, the graphical model may include a block, such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model may be set to characteristics settings, such as one or more inherited settings, one or more default settings, etc. For example, the data type of a variable that is associated with a block may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model e.g., a fundamental execution period).

Modeling system 120 may implement a technical computing environment (TCE). A TCE may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Java, etc.

In one implementation, the TCE may include dynamically typed language that can be used to express problems and/or solutions in mathematical notations familiar to those of skill in the relevant arts. For example, the TCE may use an array as a basic element, where the array may not require dimensioning. In addition, the TCE may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

The TCE may further provide mathematical functions and/or graphical tools (e.g., for creating plots, surfaces, images, volumetric representations, etc.). In one implementation, the TCE may provide these functions and/or tools using toolboxes toolboxes for signal processing, image processing, data plotting, parallel processing, etc.). In another implementation, the TCE may provide these functions as block sets. In still another implementation, the TCE may provide these functions in another way, such as via a library, etc. The TCE may be implemented as a text based environment, a graphically based environment, or another type of environment, such as a hybrid environment that is both text and graphically based.

The TCE may be implemented using products such as, but not limited to, MATLAB® by The MathWorks, Inc.; Octave; Python; Comsol Script; MAIRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dassault Systemes.

An alternative embodiment may implement a TCE in a graphically-based TCE using products such as, but not limited to, Simulink®, Stateflow®, SimEvents®, etc., by The MathWorks, Inc.; VisSim by Visual Solutions; LabView® by National Instruments; Dymola by Dassault Systemes; SoftWIRE by Measurement Computing; WiT by DALSA Coreco; VEE Pro or System Vue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) SysML environment.

A further alternative embodiment may be implemented in a language that is compatible with a product that includes a TCE, such as one or more of the above identified text-based or graphically-based TCEs. For example, MATLAB (a text-based TCE) may use a first command to represent an array of data and a second command to transpose the array. Another product, that may or may not include a TCE, may be MATLAB-compatible and may be able to use the array command, the array transpose command, or other MATLAB commands. For example, the other product may use the MATLAB commands to perform model checking.

Yet another alternative embodiment may be implemented in a hybrid TCE that combines features of a text-based and graphically-based TCE. In one implementation, one TCE may operate on top of the other TCE. For example, a text-based TCE (e.g., MATLAB) may operate as a foundation and a graphically-based TCE (e.g., Simulink) may operate on top of MATLAB and may take advantage of text-based features (e.g., commands) to provide a user with a graphical user interface and graphical outputs (e.g., graphical displays for data, dashboards, etc.).

As shown in FIG. 3, modeling system 120 may include a simulation tool 310, an entity library 320, an interface logic 330, a compiler 340, a controller logic 350, an optimizer 360, a simulation engine 370, a report engine 380, and a code generator 390.

Simulation tool 310 may include an application for building a model. Simulation tool 310 may be used to build a textual model or a graphical model having executable semantics. In the case of graphical models, simulation tool 310 may allow users to create, display, modify, diagnose, annotate, delete, print, etc., model entities and/or connections. Simulation tool 310 may interact with other entities illustrated in FIG. 1 for receiving user inputs, executing a model, displaying results, generating code, etc. Simulation tool 310 may provide a user with an editor for constructing or interacting with textual models and/or a GUI for creating or interacting with graphical models. The editor may be configured to allow a user to, for example, specify, edit, annotate, save, print, and/or publish a model. A textual interface may be provided to permit interaction with the editor. A user may write scripts that perform automatic editing operations on a model using the textual interface. For example, the textual interface may provide a set of windows that may act as a canvas for the model, and may permit user interaction with the model. A model may include one or more windows depending on whether the model is partitioned into multiple hierarchical levels.

Entity library 320 may include code modules or entities (e.g., blocks/icons) that a user can drag and drop into a display window that includes a graphical model. In the case of graphical models, a user may further couple entities using connections to produce a graphical model of a system, such as target environment 140.

Interface logic 330 may allow modeling system 120 to send or receive data and/or information to/front devices (e.g., target environment 140, processing cluster 150, etc.) or software modules (e.g., a function, an application program interface, etc.).

Compiler 340 may compile a model into an executable format. Compiled code produced by compiler 340 may be executed on computer device 110 to produce a modeling result. In an embodiment, compiler 340 may also provide debugging capabilities for diagnosing errors associated with the model. Complier 340 may generate executable code for apart of a graphical model. The executable code may then be automatically executed during execution of the model, so that a first part of the model executes as an interpreted execution and a second part of the model executes as a compiled execution.

Controller logic 350 may be used to create and implement controllers in a graphical model. For example, controller logic 350 may provide functionality for entities that represent types of controllers in the graphical model. When the graphical model executes, controller logic 350 may perform control operations on the model by interacting with entities in the graphical model. In an embodiment, controller logic 350 may include control algorithms that implement controllers in the graphical model, such as, for example, ‘proportional-integral-derivative’ (PID) controls, gain scheduling controls, H-infinity controls, model predictive controls (MPC), dynamic inversion controls, bang/bang controls, sliding mode controls, deadbeat controls, and/or other another type of controls. Embodiments of controller logic 350 may be configured to operate in standalone or distributed implementations.

Optimizer 360 may optimize code, parameters, performance (e.g., execution speed, memory usage), etc., for a model. For example, optimizer 360 may optimize code to cause the code to occupy less memory, to cause the code to execute more efficiently, to cause the code to execute faster, etc., than the code would execute if the code were not optimized. Optimizer 360 may also perform optimizations for controller logic 350, e.g., to optimize parameters for a controller. In an embodiment, optimizer 360 may operate with or may be integrated into compiler 340, controller logic 350, code generator 390, etc. Embodiments of optimizer 360 may be implemented via software objects that interact with other object oriented software, e.g., for receiving data on which optimizer 360 operates.

Simulation engine 370 may perform operations for executing a model to simulate a system. Executing a model to simulate a system may be referred to as simulating a model. Simulation engine 370 may be configured to perform standalone or remote simulations based on user preferences or system preferences.

Report engine 380 may produce a report based on information in modeling system 120. For example, report engine 380 may produce a report indicating whether a controller satisfies design specifications, a report indicating whether a controller operates in a stable manner, a report indicating whether a model compiles properly, etc. Embodiments of report engine 380 can produce reports in an electronic format for display on output device 250, in a hardcopy format, and/or a format adapted for storage in a storage device.

Code generator 390 can generate code from a model. In an embodiment, code generator 390 may be configured to compile and link the generated code to produce an “in-memory executable” version of a model. The in-memory executable version of model may be used, for example, to simulate, verify, trim, and/or linearize the model. In an embodiment, code generator 390 may receive code in a first format and may transform the code from the first format into a second format. In an embodiment, code generator 390 can generate source code, assembly language code, binary code, interface information, configuration information, performance information, task information, etc., from at least a portion of a model. For example, code generator 390 can generate C, C++, SystemC, Java, Structured Text, etc., code from the model.

Embodiments of code generator 390 can further generate Unified Modeling Language (UML) based representations and/or extensions from some or all of a graphical model (e.g., System Modeling Language (SysML), Extensible Markup Language (XML), Modeling and Analysis of Real Time and Embedded Systems (MARTE), Architecture Analysis and Design Language (AADL), Hardware Description Language (HDL), Automotive Open System Architecture (AUTOSAR), etc.). In an embodiment, optimizer 360 can interact with code generator 390 to generate code that is optimized according to a parameter (e.g., memory use, execution speed, multi-processing, etc.). Embodiments of modeling environments consistent with principles of the invention can further include components such as verification components, validation components, etc.

Although FIG. 3 shows exemplary components of modeling system 120, in other implementations, modeling system 120 may include fewer components, different components, differently arranged components, or additional components than depicted in FIG. 3. Additionally or alternatively, one or more components of modeling system 120 may perform one or more tasks described as being performed by one or more other components of modeling system 120.

Figure 4:
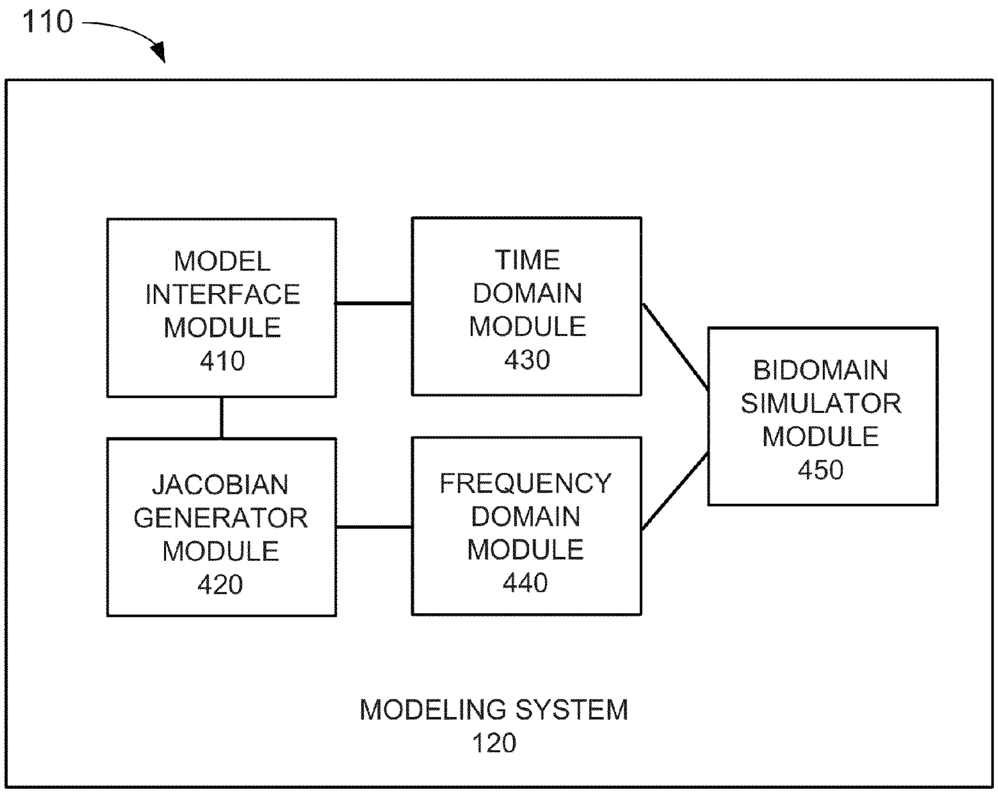
FIG. 4 is a diagram of exemplary functional components of the modeling system of FIG. 3.

FIG. 4 is a diagram of exemplary functional components of modeling system 120 that relate to a bidomain simulator. The functional components of modeling system 120 shown in FIG. 4 may be implemented, for example, as part of simulation tool 310, entity library 320, and/or any of the other components of modeling system 120 described above in connection with FIG. 3. Furthermore, the functional components of modeling system 120 shown in FIG. 4 may be implemented by processor 220 and memory 230 of computer device 110. Additionally or alternatively, some or all of the functional components of modeling system 120 shown in FIG. 4 may be implemented by hard-wired circuitry. As shown in FIG. 4, modeling system 120 may include a model interface module 410, a Jacobian generator module 420, a time domain module 430, a frequency domain module 440, and a bidomain simulator module 450.

Model interface module 410 may provide a framework to enable the user to select a bidomain simulator to be generated in connection with a simulation of a graphical model. Model interface module 410 may enable the user to select one or more input points and/or one or more output points to define a sub-system that may include some, or all, of the graphical model. Furthermore, model interface module 410 may enable the user to select simulation parameters for a simulation of a graphical model (e.g., start and stop time points, a time step value, a solver type, time points at which to compute a frequency response, etc.). Moreover, model interface module 410 may enable a user to include a bidomain simulator block in the graphical model and may enable the user to define an output signal for the bidomain simulator block.

Jacobian generator module 420 may generate a Jacobian matrix for a graphical model at a particular time point during a simulation of the graphical model. For example, Jacobian generator module 420 may determine a block Jacobian associated with blocks in the graphical model. Jacobian generator module 420 may generate an open loop Jacobian matrix for the graphical model, or part of the graphical model, and may generate a connection matrix for the graphical model, or part of the graphical model. Jacobian generator module 420 may generate a closed loop Jacobian matrix at the particular time point by, for example, performing a linear fractional transformation on the open loop Jacobian matrix with respect to the generated connection matrix.

Time domain module 430 may determine a time domain response for a graphical model, or a part of a graphical model, at a particular time point during a simulation. Time domain module 430 may select a solver to use during the simulation. For example, time domain module 430 may select to use an explicit solver or an implicit solver. The solver may be selected based on, for example, a stiffness property associated with the dynamic system represented by the graphical model. An implicit solver may compute the closed loop Jacobian matrix during the simulation. The computed closed loop Jacobian matrix may be used to determine a frequency response for the graphical model.

Frequency domain module 440 may determine a frequency response for a graphical model, or part of a graphical model, at one or more selected time points during the simulation. The frequency response may be determined using a closed loop Jacobian matrix generated by Jacobian generator module 420. For example, a transfer function may be derived from the closed loop Jacobian matrix and a frequency response may be generated from the transfer function. For example, the transfer function may be converted to a Laplace transform using a change of variable. The Laplace transform may be used, for example, to determine the magnitude at a particular frequency to generate a magnitude plot, to determine the phase shift at a particular frequency to generate a phase plot. The magnitude and phase plots may be used to generate a Bode plot.

Frequency domain module 440 may generate a particular type of a frequency response plot. As an example, frequency domain module 440 may generate a frequency response plot in a Fourier domain, a Laplace domain, or in a Z domain. As another example, frequency domain module 440 may generate a Bode plot, a Root Locus plot, a Pole-zero plot, a Nyquist plot, or a Nichols plot.

Bidomain simulator module 450 may generate a bidomain simulator interface based on a simulation of the graphical model. For example, bidomain simulator module 450 may generate a time domain plot based on a time domain response generated by time domain module 430 and may generate a frequency domain plot based on a frequency domain response generated by frequency response module 440. Bidomain simulator module 450 may display both the time domain plot and the frequency domain plot in a same user interface affordance (e.g., a window, a multiple document interface (MDI), a single pane, a split pane, a canvas, etc.). Bidomain simulator module 450 may enable a user to change the frequency domain plot to a different type of frequency domain plot (e.g., from a Bode plot to a Nichols plot, etc.).

Bidomain simulator module 450 may enable a user to select a subset of either the time domain plot or the frequency domain plot and may provide an indication of a corresponding subset on the other one of the time domain plot or the frequency plot. Bidomain simulator module 450 may enable the user to annotate one or both of the time domain plot or the frequency domain plot. Bidomain simulator module 450 may enable the user to define a trigger event that may be triggered if a particular condition is satisfied in either the time response or the frequency response. As example, the user may define an alarm if a particular frequency range, a frequency response magnitude, a frequency response phase, or a phase margin is exceeded.

Bidomain simulator module 450 may enable the user to define one or more source signals that may be generated based on the determined frequency response. For example, a user my select to generate a source signal based on a gain margin associated with the frequency response, based on a phase margin associated with the frequency response, based on a damping ratio associated with the frequency response, based on a resonant or anti-resonant frequency associated with the frequency response, and/or based on another type of signal associated with the frequency response. The generated source signal may be used as an input signal for one or more blocks in the graphical model.

Although FIG. 4 shows exemplary functional components of modeling system 120, in other implementations, modeling system 120 may include fewer functional components, different functional components, differently arranged functional components, or additional functional components than depicted in FIG. 4. Additionally or alternatively, one or more components of modeling system 120 may perform one or more tasks described as being performed by one or more other components of modeling system 120.

Figure 5:
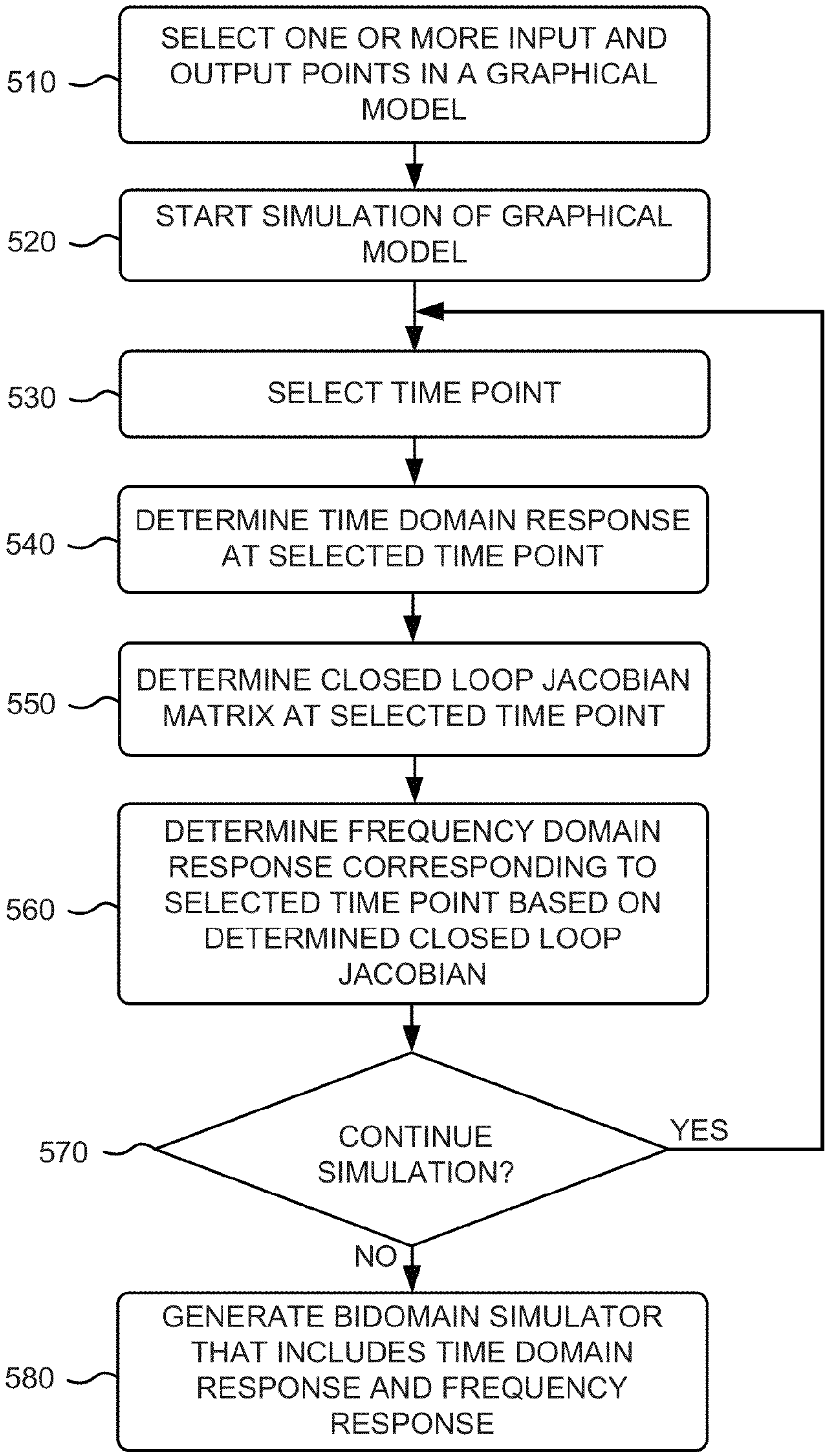
FIG. 5 is a flow diagram of an exemplary process for generating a bidomain simulator interface according to an implementation described herein.

FIG. 5 is a flow diagram of an exemplary process for generating a bidomain simulator interface according to an implementation described herein. In one implementation, the process of FIG. 5 may be performed by computer device 110. In other implementations, some or all of the process of FIG. 5 may be performed by another device or a group of devices separate from computer device 110 and/or including computer device 110.

The process of FIG. 5 may include selecting one or more input and output points in a graphical model (block 510). For example, a user may select one or more input points and one or more output points in a graphical model. The selected one or more input points and one or more output points may define a closed loop Jacobian system within the graphical model.

Figure 8A:
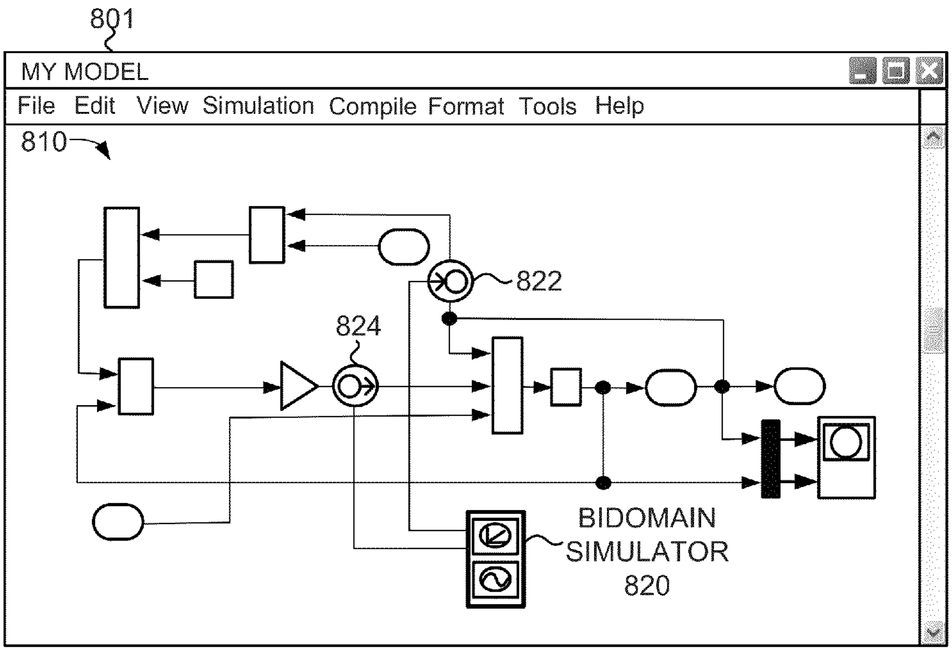
FIGS. 8A-8B are exemplary diagrams of graphical models according to an implementation described herein.

In one example, a user may select an input signal associated with a block in the graphical model by selecting (e.g., by clicking on, etc.) a connector line connected to the block (see, for example, FIG. 8A). The user may similarly select an output signal associated with a block in the graphical model by clicking on a connector line connected to the block. When the user has finished selecting input and output points, the user may select to activate the bidomain simulator. Model interface module 410 may analyze the user's selections of an input point and an output point, of a collection of blocks, of a subsystem, and/or of another selection of a subset of elements of the graphical model defined by the user's selections. Model interface module 410 may determine whether the selected subsystem includes any inputs or outputs that have not been selected by the user and may inform the user about the additional input and/or outputs associated with the subsystem defined by the user's selections.

Figure 8B:
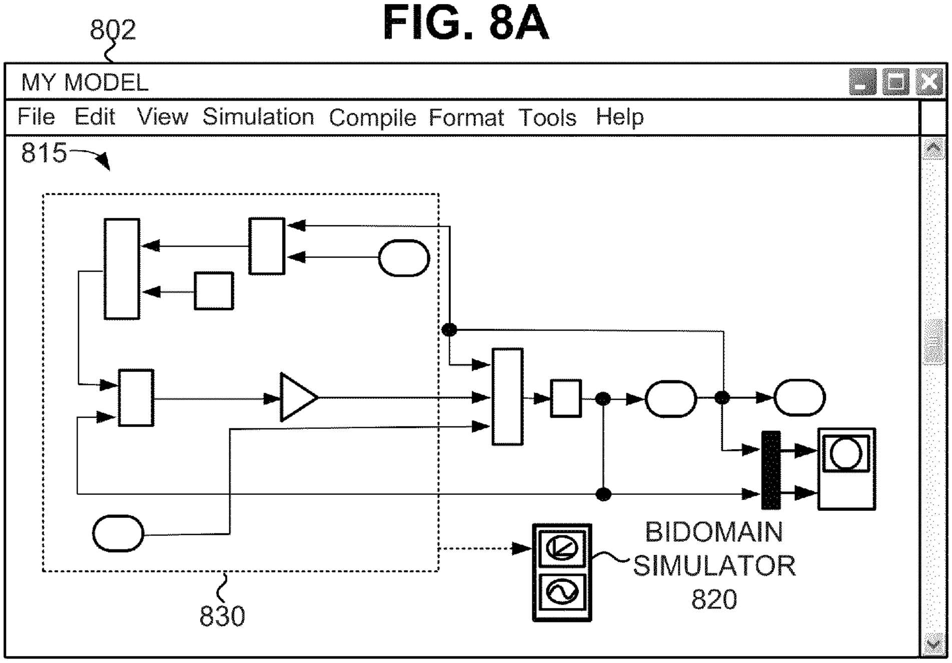

In another example, a user may select a subsystem of the graphical model by, for example, drawing a container shape around some, or all, of the graphical model (see, for example, FIG. 8B). The user may subsequently select to activate the bidomain simulator and model interface module 410 may determine inputs and outputs associated with the selected subset of the graphical model.

In yet another example, an input point and an output point may be selected based on an open loop Jacobian matrix. For example, a connection matrix associated with the open loop Jacobian matrix may be analyzed to determine connections that connect a source block or a sink block to another block in the graphical model. In an embodiment, at least part of a connection matrix may be presented to a user and the user may select an input point and an output point by indicating an entry in the matrix.

In yet another example, an input and an output point may be selected based on connections to a bidomain simulator block. For example, a user may place a bidomain simulator block on the graphical model and may make a connection from a particular point on the graphical model to the bidomain simulator block.

Simulation of the graphical model may be started (block 520). For example, simulation tool 310 may start a simulation of the graphical model based on one or more parameters specified by the user. Time domain module 430 may generate a time domain response at particular time points during the simulation.

A time point may be selected (block 530). For example, frequency domain module 440 may select a particular time point during the simulation at which to determine a frequency response. Frequency domain module 440 may select time points at which the frequency response may be likely to provide useful information about the graphical model.

As an example, frequency domain module 440 may select a time point at which the time domain response changes by at least a threshold value from a value at previous time point during the simulation and may determine the frequency response at the selected time point. When the time response differs from a first time point to a second time point by a substantial amount, a first frequency response, associated with the first time point, may significantly differ from a second frequency response, associated with the second time point.

As another example, frequency domain module 440 may determine that a solver used during the simulation has exceeded an error tolerance and may select to determine the frequency response at a time point when the solver has exceeded the error tolerance. A solver exceeding the error tolerance may be indicative of a significant change in the frequency response of the graphical model.

As yet another example, frequency domain module 440 may determine that a solver has reset and may select to determine the frequency response at a time point when the solver has reset. A solver reset may be indicative of a significant change in the frequency response of the graphical model.

As yet another example, frequency domain module 440 may determine that a solver has increased a step size during the simulation and may select to determine the frequency response at a time point when the solver has increased the step size. An increase in the solver step size may be indicative a significant change in the frequency response of the graphical model.

As yet another example, frequency domain module 440 may detect a failure associated with an integration step during the simulation and may select to determine the frequency response at a time point when the integration step failure was detected. An integration step failure may indicate a discontinuity and may be indicative of a significant change in the frequency response of the graphical model.

As yet another example, frequency domain module 440 may detect a user-defined event associated with the solver used during the simulation. In response, frequency domain module 440 may select to determine the frequency response at a time point corresponding to the user-defined event. As yet another example, a user-defined event need to be associated with a solver. In particular, a user may use any of the variables in a model to define an event, in either the time domain or the frequency domain, at which a Jacobian matrix should be computed.

A time domain response at the selected time point may be determined (block 540). For example, time domain module 430 may determine a time domain response of the graphical model, or of the selected subset of the graphical model. A closed loop Jacobian matrix may be determined at the selected time point (block 550). In one example, an implicit solver may have been selected for the simulation. An implicit solver may need to compute a Jacobian matrix to solve the time domain response of the graphical model. The Jacobian matrix may represent a linear model that corresponds to a continuous part of the graphical model at a particular time step of the simulation. The Jacobian matrix computed by the implicit solver during the simulation may be used to determine the frequency response.

In another example, a Jacobian matrix may not be available as a result of a solver process. When the Jacobian matrix is not available, the Jacobian matrix may need to be computed by Jacobian generator module 420. Jacobian generator module 420 may determine block Jacobian matrices for the blocks of the graphical model that are involved in the simulation. Jacobian generator module 420 may concatenate the block Jacobian matrices and may further determine the connection matrix for the concatenated block Jacobian matrices to determine the open loop Jacobian matrix (e.g., based on Equation (6)) for the graphical model, or for a selected subset of the graphical model.

Jacobian generator module 420 may further determine a closed loop Jacobian matrix for the selected time point by performing a linear fractional transformation matrix on the open loop Jacobian matrix with respect to the connection matrix.

A frequency domain response corresponding to the selected time point may be determined based on the determined closed loop Jacobian matrix (block 560). For example, frequency domain module 440 may generate a frequency response plot based on a closed loop Jacobian matrix generated by Jacobian generator module 420 or generated by an implicit solver at the selected time point. A transfer function between the input and output points in a graphical model, selected by the user, may be derived from the closed loop Jacobian matrix between the input and output points. The frequency response may be determined based on the transfer function.

For example, if a Bode plot is to be generated, frequency domain module 440 may generate a magnitude plot and a phase plot based on the transfer function derived from the closed loop Jacobian matrix. The magnitude at a particular frequency may be determined, for example, by determining the magnitude of the transfer function at the particular frequency. The phase shift at the particular frequency may be determined, for example, by determining an inverse tangent of a ratio between the imaginary and real components of the transfer function. As another example, a Pole-zero plot may be determined by factoring out the transfer function into pole-zero form (e.g., into a ratio of a numerator polynomial and a denominator polynomial, where roots of the numerator polynomial correspond to the zeros of the system and where the roots of the denominator polynomial correspond to the poles of the system).

The frequency response plot may be of a default type or of a type selected by the user. For example, frequency domain module 440 may generate a frequency response plot in the Fourier domain the Laplace domain, in the Z domain, or in another domain. As another example, frequency domain module 440 may generate a Bode plot, a Root Locus plot, a Pole-zero plot, a Nyquist plot, a Nichols plot, or another type of frequency domain plot.

A graphical model may include both continuous blocks, or sets of blocks, and discrete blocks, or sets of blocks. The frequency response of the continuous part of the model may be computed by reusing a Jacobian matrix computed by a continuous solver. The frequency response of the discrete part of the model may be computed at certain time by linearizing the discrete part of the model.

A determination may be made as to whether to continue the simulation (block 570). For example, simulation tool 310 may determine whether the end point of the simulation has been reached based on an end point selected by the user or selected based on another factor associated with the configuration of the simulation. If it is determined that the simulation is to be continued (block 570—YES), processing may return to block 530 to select another time point.

If it is determined that the simulation is not to be continued (block 570—NO), processing may continue to block 580 to generate a bidomain simulator that includes a time domain response and a frequency domain response (block 580). For example, bidomain simulator module 450 may generate a bidomain simulator user interface that includes a time domain response plot generated by time domain module 430 and a frequency domain response plot generated by frequency domain module 440.

Figure 6:
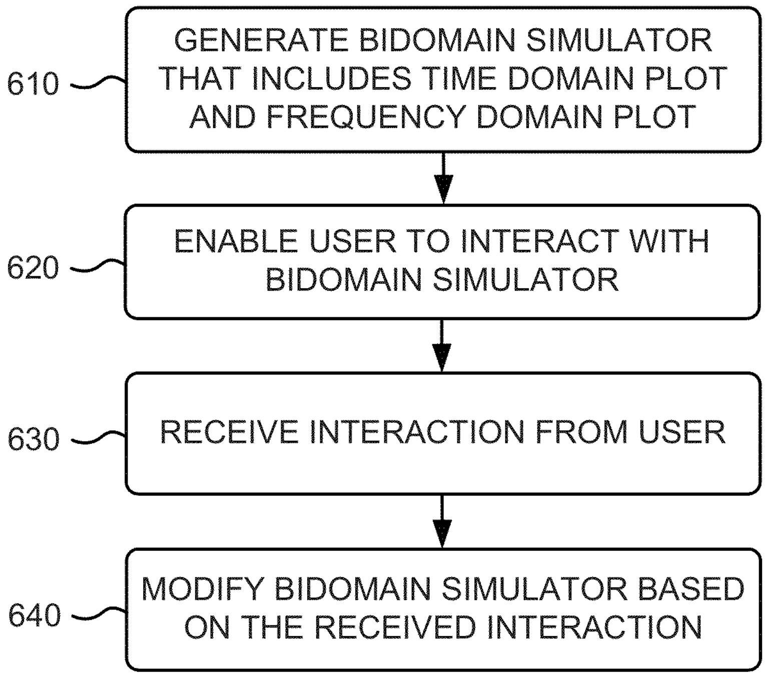
FIG. 6 is a flow diagram of an exemplary process for correlating a selection in a bidomain simulator according to an implementation described herein.

FIG. 6 is a flow diagram of an exemplary process for correlating a selection in a bidomain simulator according to an implementation described herein. In one implementation, the process of FIG. 6 may be performed by computer device 110. In other implementations, some or all of the process of FIG. 6 may be performed by another device or a group of devices separate from computer device 110 and/or including computer device 110.

The process of FIG. 6 may include generating a bidomain simulator that includes a time domain plot and a frequency domain plot (block 610). For example, bidomain simulator module 450 may generate bidomain simulator user interface that includes a time domain response and a frequency domain response generated based on a simulation of a graphical model. In one example, the bidomain simulator user interface may be displayed after the simulation is completed. In another example, the bidomain simulator user interface may be displayed during the simulation.

The user may be enabled to interact with the bidomain simulator (block 620), an interaction from the user may be received (block 630), and the bidomain simulator may be modified based on the received interaction (block 640). As an example, bidomain simulator module 450 may enable a user to select a point or a subset of points on the time domain response plot and may detect a selection of a point or a subset of points on the time domain response plot (e.g., the user may click on a particular point of the time domain response plot, the user may type in a time domain value or a range of time domain values, etc.). In response, bidomain simulator module 450 may provide an indication of a corresponding line, or a set of lines, on the frequency domain response plot. For example, if the user selects a point on the time domain plot, a corresponding line or area on the frequency domain plot may be highlighted.

As another example, bidomain simulator module 450 may enable a user to select a line, or a set of lines, on the frequency domain response plot. In response, bidomain simulator module 450 may provide an indication of a corresponding point, or a set of points, on the time response domain plot. For example, if the user selects a line on the frequency response domain plot, a corresponding point on the time domain response plot may be highlighted.

As yet another example, bidomain simulator module 450 may provide one or more selection objects in the bidomain simulator user interface, such as a drop menu, a check box, a radio button, and/or another type of selection object. The selection objects may enable the user to interact with the bidomain simulator interface to, for example, select a type of frequency domain plot, annotate one or both of the time domain plot or the frequency domain plot, define a trigger event for one or both of the time domain plot or the frequency domain plot, define a source signal to be generated by the bidomain simulator, and/or select another type of interaction with the bidomain simulator.

For example, a drop down menu (or another type of selection object) may enable the user to select a particular type of frequency response plot. The user may select another type of frequency response plot, different from a currently displayed frequency response plot, and bidomain simulator module 450 may change displayed frequency response plot to the selected type of frequency response type.

As another example, the user may select to annotate one or both of the time domain plot and the frequency domain plot. For example, the user may select to generate a legend for one or both of the time domain plot or the frequency domain plot, may select to generate an animation that highlights, in sequence, a set of time domain points and a corresponding set of frequency domain lines, and/or may select another type of annotation that may be available in the bidomain simulator user interface. As yet another example, the user may select to define a trigger event for one or both of the time domain plot or the frequency domain plot. For example, the user may select that an alarm be activated if a particular magnitude at a particular frequency is reached during the simulation.

As yet another example, the user may select to define a source signal to be generated by the bidomain simulator. For example, a user may select to generate a source signal based on a gain margin associated with the frequency response, based on a phase margin associated with the frequency response, based on a damping ratio associated with the frequency response, based on a resonant or anti-resonant frequency associated with the frequency response, and/or based on another type of signal associated with the frequency response. The generated source signal may be used as an input signal for one or more blocks in the graphical model.

As yet another example, a user may select a time point or a frequency response line and may select to produce a closed loop Jacobian matrix corresponding to the selected time point or frequency response line. The closed loop Jacobian matrix may be written to a logical workspace associated with the graphical model and may be used by the user as input for further processing and/or analysis, and/or as an input source signal for a particular block or set of blocks associated with the graphical model.

Figure 7:
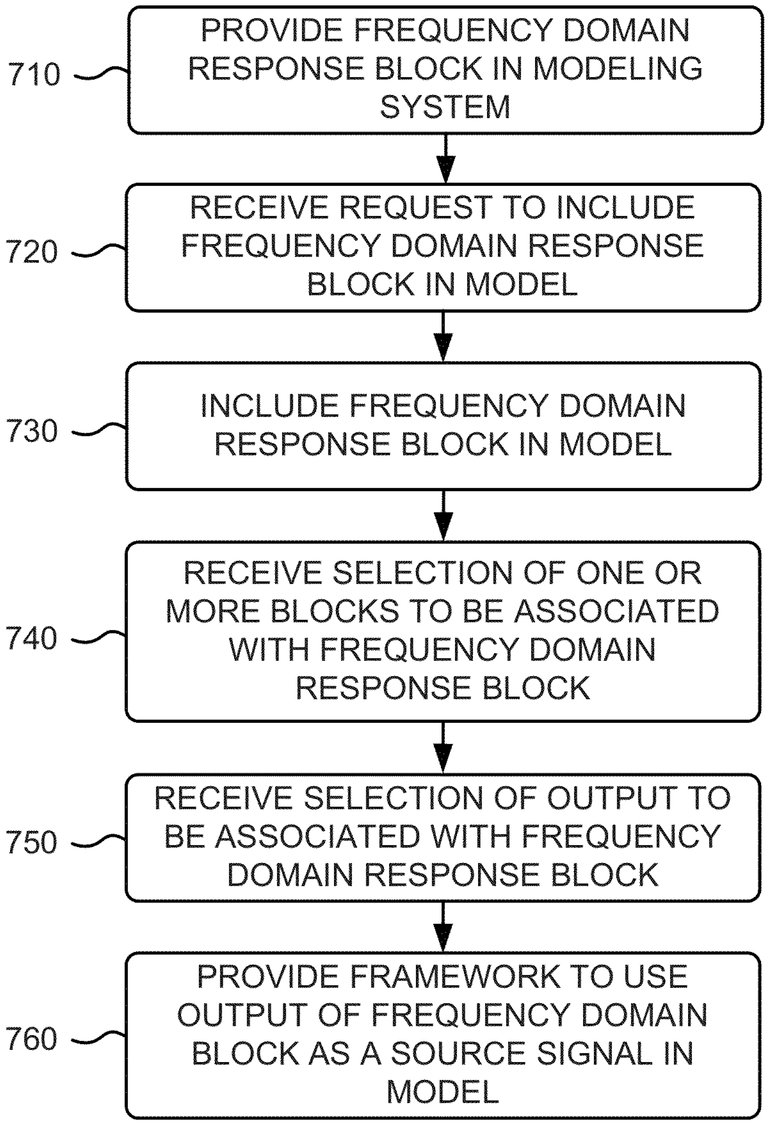
FIG. 7 is a flow diagram of an exemplary process for providing a source signal from a bidomain simulator according to an implementation described herein.

FIG. 7 is a flow diagram of an exemplary process for providing a source signal from a bidomain simulator according to an implementation described herein. In one implementation, the process of FIG. 7 may be performed by computer device 110. In other implementations, some or all of the process of FIG. 7 may be performed by another device or a group of devices separate from computer device 110 and/or including computer device 110.

The process of FIG. 7 may include providing a frequency domain response block in a modeling system (block 710), a request may be received to include the frequency domain response block in a model (block 720), and a frequency domain response block may be included in the model in response (block 730). As an example, a user may include a bidomain simulator block in a graphical model. As another example, the user may include a frequency domain response block that that may not necessarily include a corresponding time domain plot.

A selection of one or more blocks to be associated with the frequency response block may be received (block 740). For example, the user may select an input point and/or an output point in a graphical model and connect the selected input point and/or output point to the frequency domain response block. As another example, the user may draw a box around a subset of blocks in the graphical model. The frequency domain response block may determine the frequency response between the selected input and output points or the frequency response of the selected subset of blocks.

A selection of an output to be associated with the frequency domain response block may be received (block 750) and a framework may be provided to use the output of the frequency response block as a source signal in the model (block 760). For example, the user may select an output for the frequency domain response block and may connect the output to another block in the graphical model. The user may select a particular type of signal for the output, such as, for example, a frequency associated with the highest magnitude, a gain margin associated with the frequency response, a phase margin associated with the frequency response, a damping ratio associated with the frequency response, a resonant frequency associated with the frequency response, an anti-resonant frequency associated with the frequency response, and/or another type of signal associated with the frequency response. The generated output signal may be used as a source signal to the block to which the signal has been connected. For example, the user may connect a phase margin signal to a switch and the switch may be triggered when the phase margin reaches or exceeds a particular value.

FIGS. 8A-8B are exemplary diagrams of graphical models according to an implementation described herein. FIG. 8A illustrates an exemplary modeling user interface 801. As shown in FIG. 8A, modeling user interface 801 may include a graphical model 810. Graphical model 810 may include multiple interconnected blocks and may include a bidomain simulator block 820. The user may select an input point 822 and an output point 824 connected to bidomain simulator block 820. Bidomain simulator block 820 may determine a time domain response and a frequency domain response in a subset of graphical model 810 between input point 822 and output point 824 and may display both the time domain response and the frequency domain response in the same user interface as described above with reference to FIG. 5.

FIG. 8B illustrates an exemplary modeling user interface 802. As shown in FIG. 8B, modeling user interface 802 may include a graphical model 815. Graphical model 815 may include multiple interconnected blocks and may include bidomain simulator block 820. The user may select a subset of graphical model 815 by drawing a box 830 around a subset of graphical model 815. Bidomain simulator block 820 may determine a time domain response and a frequency domain response in a subset of graphical model 810 defined by box 830 and may display both the time domain response and the frequency domain response in the same user interface as described above with reference to FIG. 5.

Figure 9A:
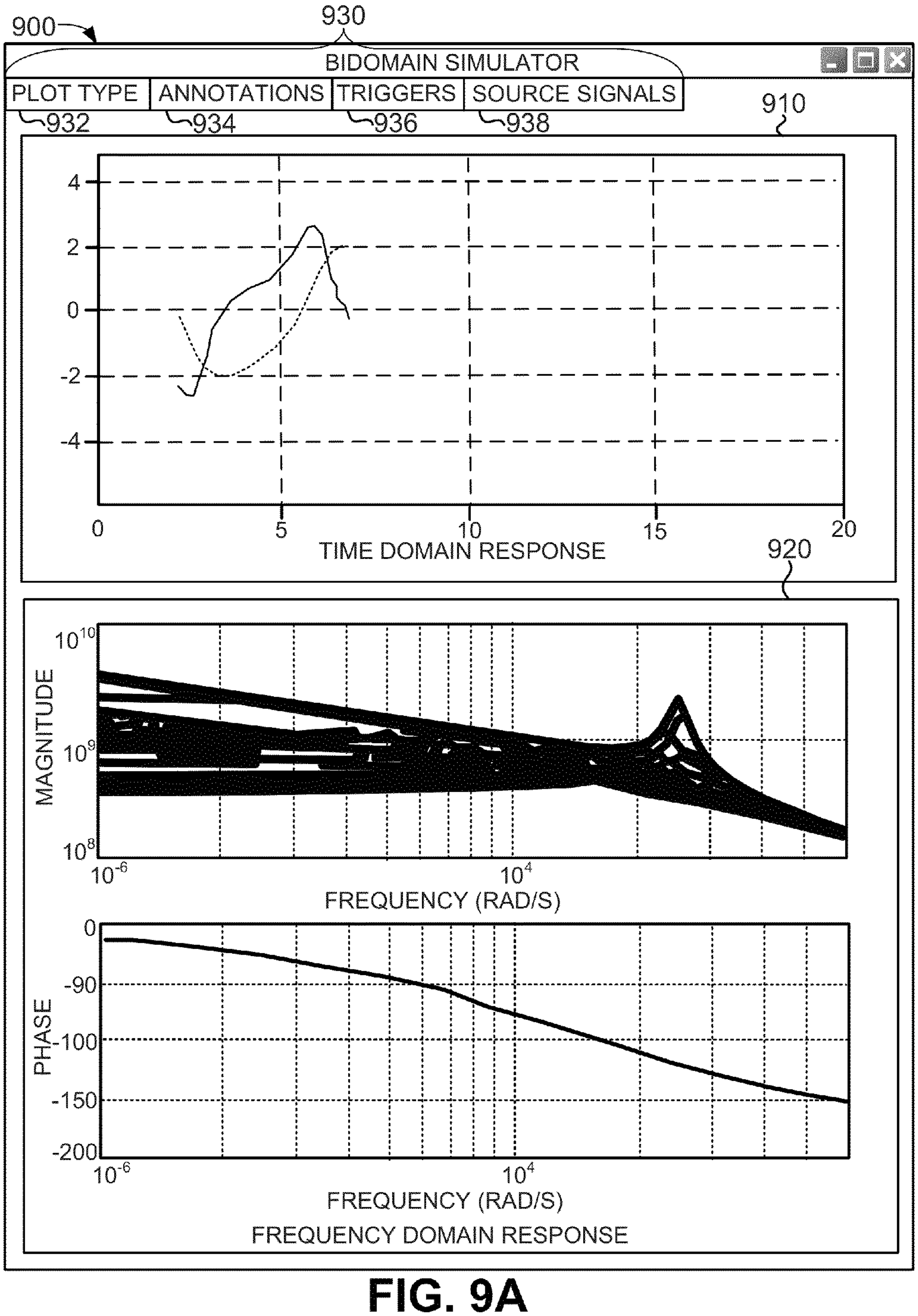
FIGS. 9A-9E, are exemplary diagrams of bidomain simulator user interfaces according to an implementation described herein.

FIGS. 9A-9E are exemplary diagrams of bidomain simulator user interfaces according to an implementation described herein. For example, FIGS. 9A-9E may correspond to user interfaces generated by the process described above with reference to FIG. 6, FIG. 9A illustrates an exemplary bidomain simulator user interface 900. Bidomain simulator user interface 900 may include a time domain response plot 910 and a frequency domain response plot 920 generated by modeling system 120 as described above. In FIG. 9A, frequency domain response plot 920 may correspond to a Bode plot that includes a magnitude plot and phase plot. Bidomain simulator user interface 900 may further include an interaction menu 930. Interaction menu 930 may enable a user to interact with bidomain simulator user interface 900. In one implementation, interaction menu 930 may include a plot type submenu 932, an annotations submenu 934, a triggers submenu 936, and a source signals submenu 938. In another implementation, interaction menu 930 may include fewer submenus, different submenus, differently arranged submenus, additional submenus than shown in FIGS. 9A-9E.

Figure 9B:
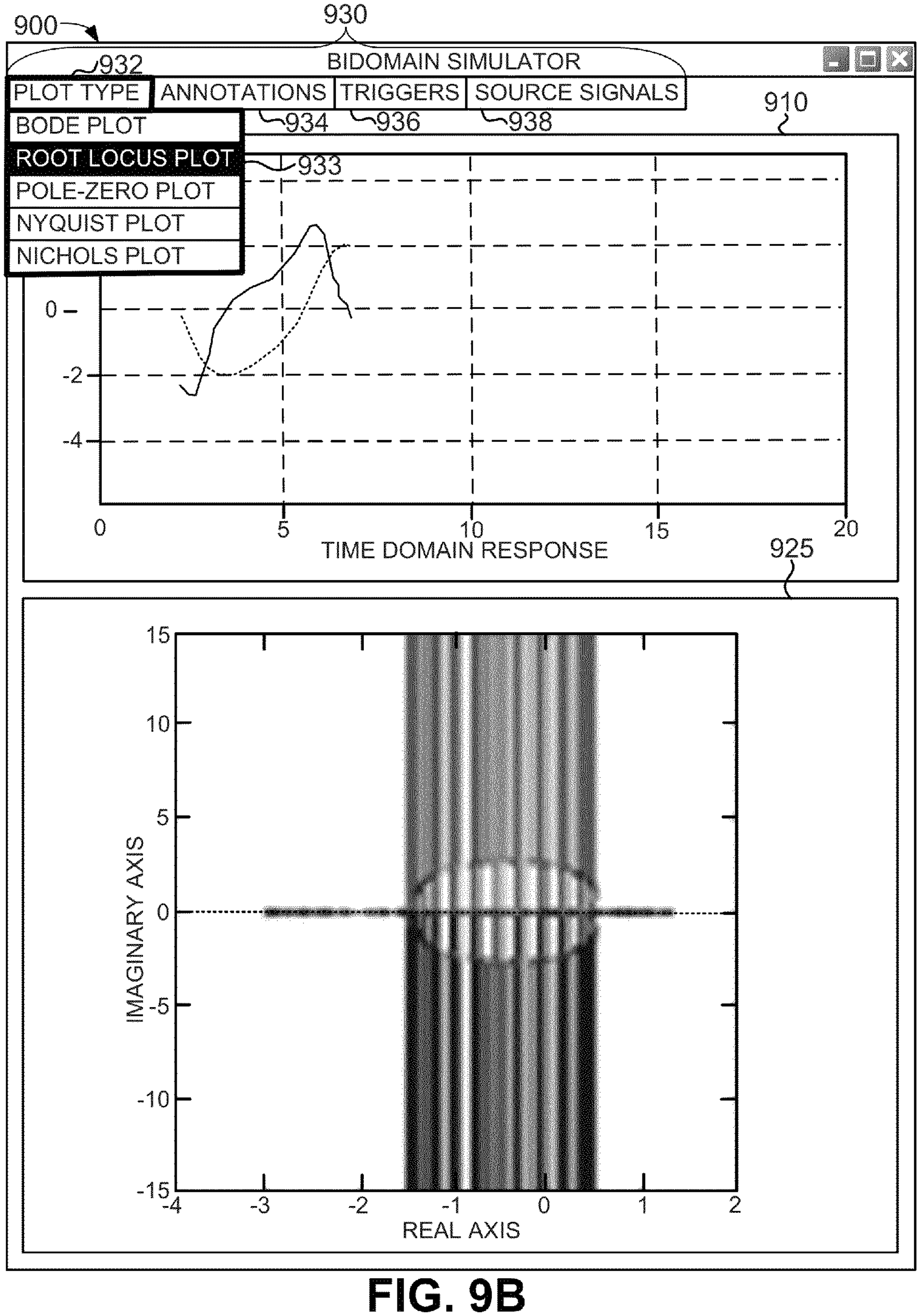

FIG. 9B illustrates bidomain simulator user interface 900 with the user selecting plot type submenu 932. The user may select a different type of frequency don response plot from plot type submenu 932. For example, in FIG. 9B, the user has selected a Root Locus plot from plot type submenu 932. In response, bidomain simulator module 450 may change the frequency domain response plot from a Bode plot to a Root Locus plot.

Figure 9C:
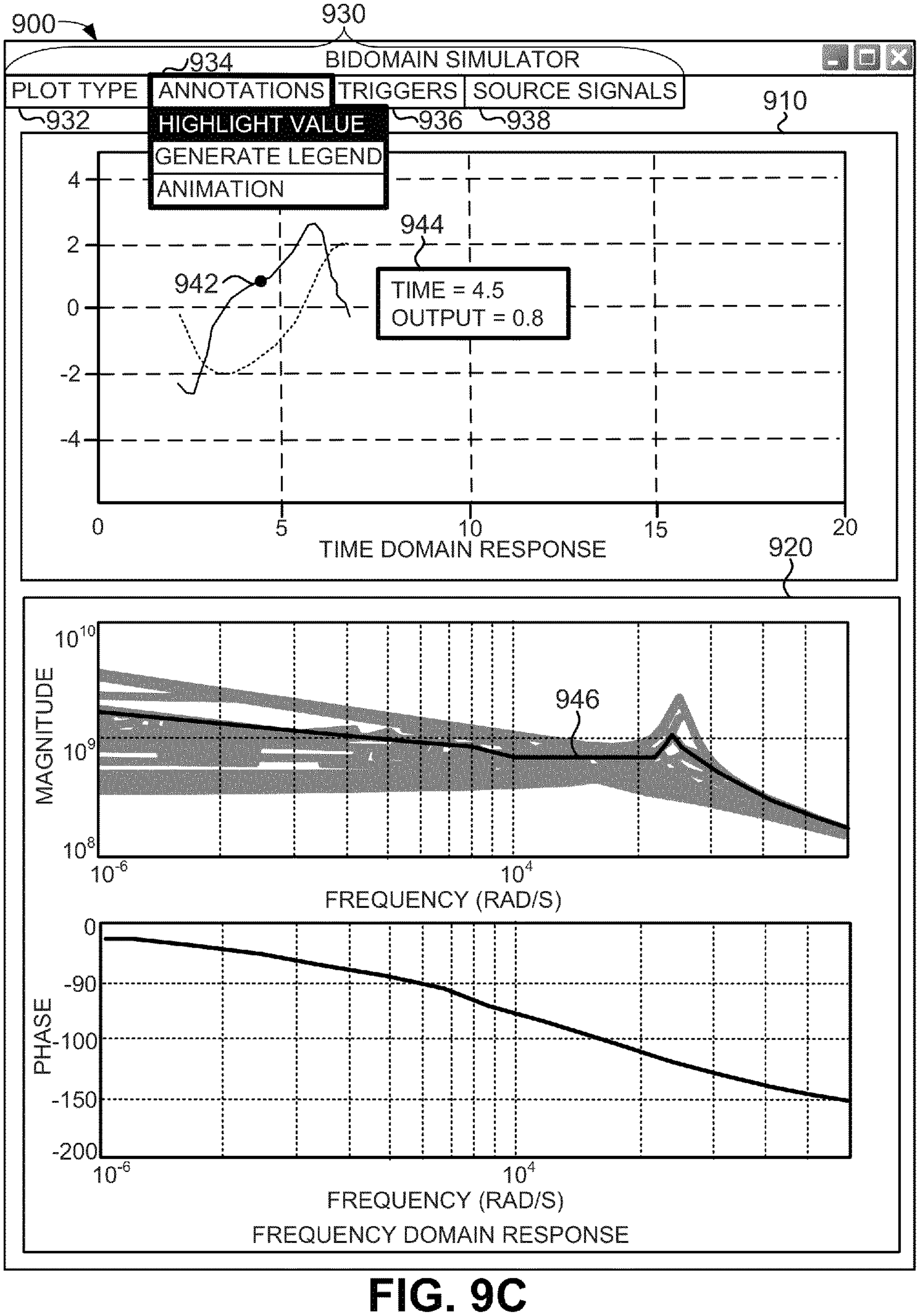

FIG. 9C illustrates bidomain simulator user interface 900 with the user selecting annotations submenu 934. For example, the user may click on time domain response point 942 and a window 944 may appear, displaying the time value and the output value associated with point 942. Furthermore, a frequency domain response line 946 corresponding to selected point 942 may be highlighted in frequency domain response plot 920. Additionally, or alternatively, all other frequency domain response lines may be lowlighted.

Figure 9D:
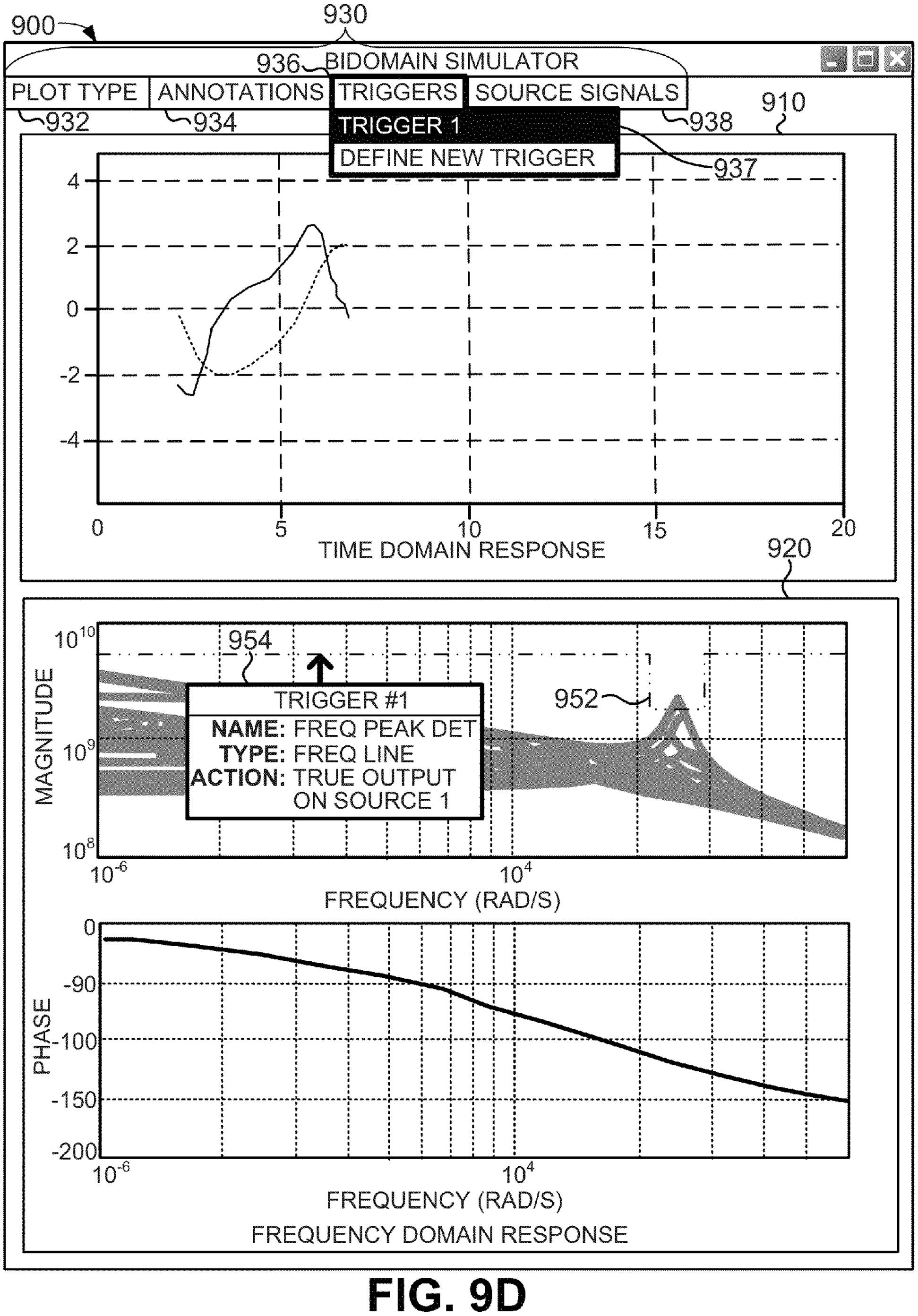

FIG. 9D illustrates bidomain simulator user interface 900 with the user selecting triggers submenu 936. For example, the user may select to define a new trigger 952 on frequency domain response plot 920. Trigger 952 may be activated when the frequency response at a particular frequency exceeds a specified magnitude. Window 954 may include information associated with trigger 952 and may define a type of action to be performed when the trigger is activated. For example, the action associated with trigger 952 may correspond to outputting a true signal on a source output signal 1 that may be generated by a bidomain simulator block in a graphical model.

Figure 9E:
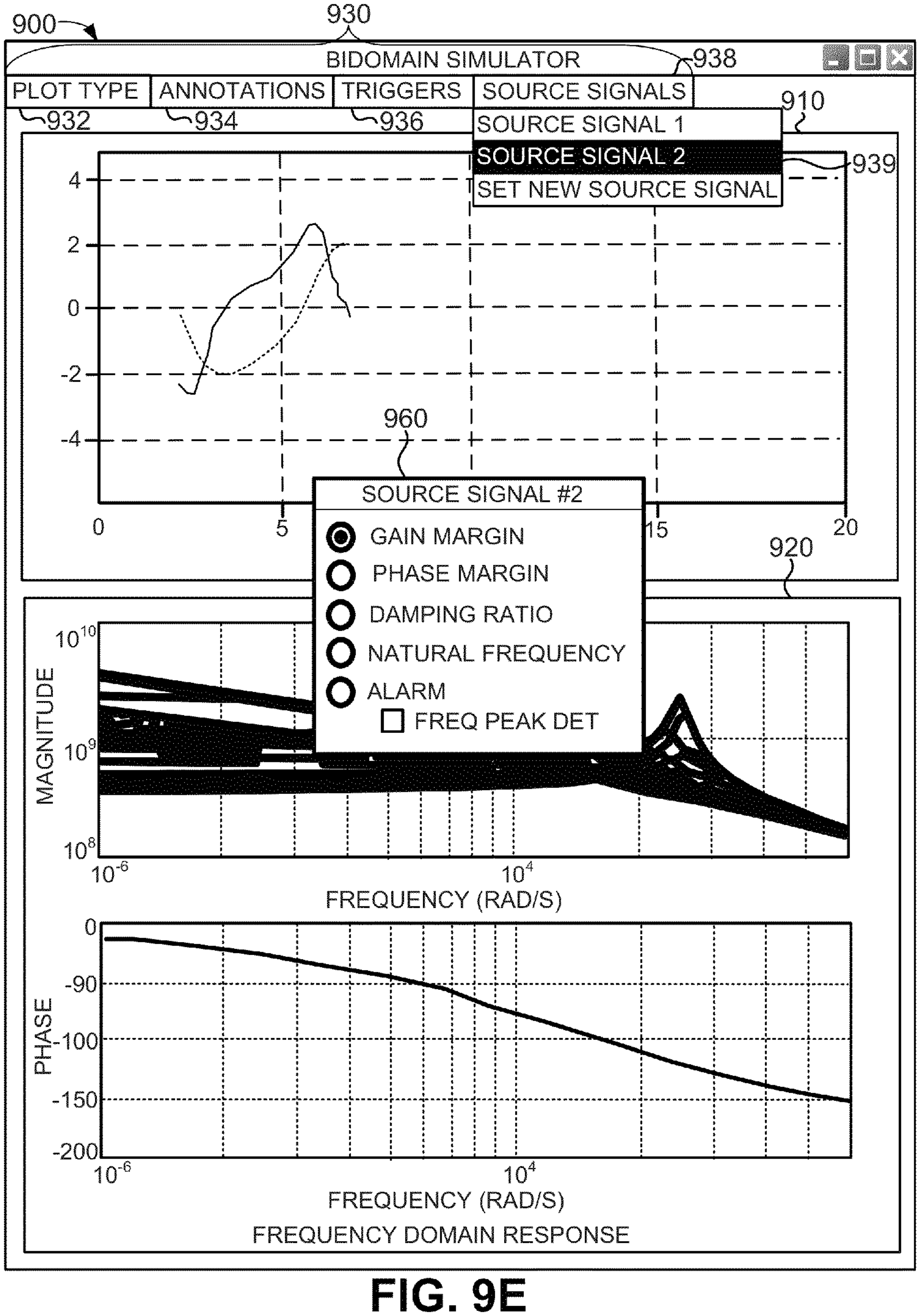

FIG. 9E illustrates bidomain simulator user interface 900 with the user selecting source signals submenu 938. For example, the user may select to generate a new source signal by selecting a new source signal 939 from source signal submenu 938. A source signal window 960 may be generated in response and the user may select a type of source signal to generate. Source signal window 960 shows that a user may select a gain margin source signal, a phase margin source signal, a damping ratio source signal, a natural frequency source signal, or an alarm source signal based on a previously defined alarm. In another implementation, source signal window 960 may include fewer source signal types, different source signal types, differently arranged source signal types, or additional source signal types than shown in FIG. 9E.

Figure 10:
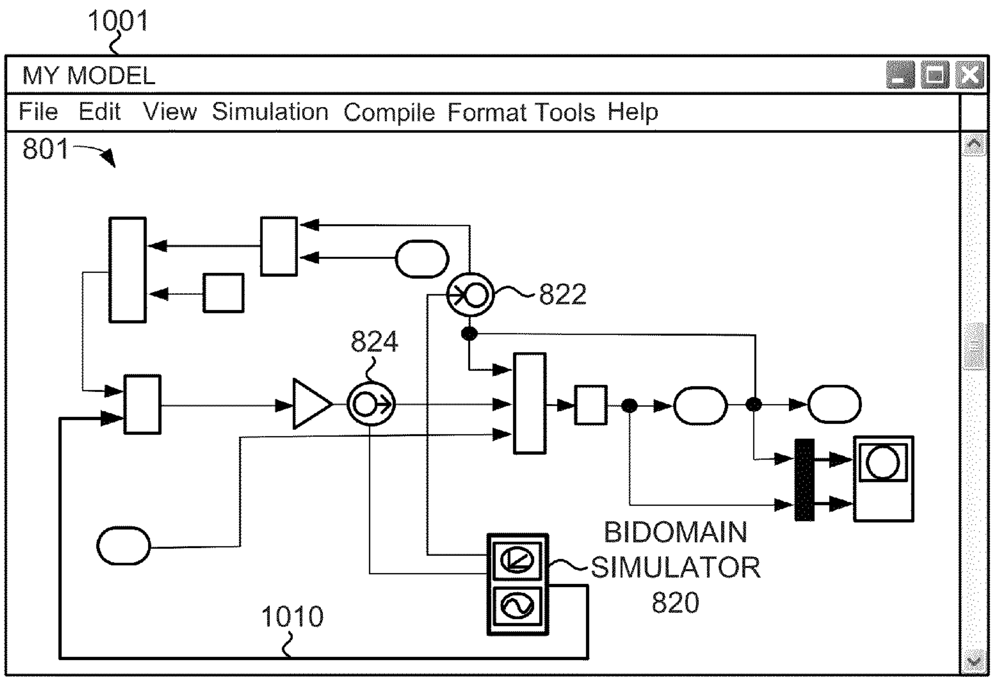
FIG. 10 is an exemplary diagram of a graphical model that includes a bidomain simulator block according to an implementation described herein.

FIG. 10 is an exemplary diagram of a modeling user interface 1001 that includes graphical model 810. For example, FIG. 10 may correspond to a user interface generated by the process described above with reference to FIG. 7. Graphical model 810 may include bidomain simulator block 820 with input point 822 and output point 824. Graphical model 810 may further include bidomain simulator output signal 1010. Bidomain simulator output signal 1010 may be used as a source signal to another block in graphical model 810.

The foregoing description provides illustration and description, but is not intended to be exhaustive or to limit the implementations to the precise form disclosed. Modifications and variations are possible in light of the above teachings or may be acquired from practice of the described implementations.

For example, while series of blocks have been described with respect to FIGS. 5-7, the order of the blocks may be modified in other implementations. Further, non-dependent blocks may be performed in parallel.

Also, certain portions of the implementations may have been described as a “component,” “logic,” “tool,” “engine,” and/or “system” that performs one or more functions. The described “component,” “logic,” “tool,” “engine,” and/or “system” may include hardware, such as a processor, an ASIC, or a FPGA, or a combination of hardware and software (e.g., software running on a processor).

It will be apparent that aspects, as described above, may be implemented in many different forms of software, firmware, and hardware in the implementations illustrated in the figures.

The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

What is claimed is:

1. A method, performed by a computer device, the method comprising:

selecting one or more input and output points in an executable graphical model in a modeling application, wherein the selecting is performed by the computer device;

simulating the executable graphical model over a plurality of time points, wherein the simulating is performed by the computer device;

generating a time domain response plot for the executable graphical model based on the simulating, wherein the generating is performed by the computer device;

obtaining matrices of partial derivatives based on the selected one or more input and output points at particular time points of the plurality of time points, wherein the matrices of partial derivatives include a first matrix of partial derivatives of a derivative function with respect to state variables, a second matrix of partial derivatives of the derivative function with respect to inputs, a third matrix of partial derivatives of an output function with respect to the state variables, and a fourth matrix of partial derivatives of the output function with respect to the inputs, and wherein the obtaining is performed by the computer device;

generating a frequency domain response plot for the executable graphical model based on the obtained matrices of partial derivatives, wherein the generating is performed by the computer device; and generating a bidomain simulator user interface, the bidomain simulator user interface comprising:

the generated time domain response plot, and the generated frequency domain response plot, wherein the generating is performed by the computer device.

2. The method of claim 1, further comprising:

obtaining a closed loop Jacobian matrix based on the obtained matrices of partial derivatives; and wherein generating a frequency domain response plot for the executable graphical model based on the obtained matrices of partial derivatives includes:

generating a frequency domain response plot for the executable graphical model based on the obtained closed loop Jacobian matrix.

3. The method of claim 2, wherein obtaining a closed loop Jacobian matrix based on the obtained matrices of partial derivatives includes:

determining an open loop Jacobian matrix based on the obtained matrices of partial derivatives;

determining a connection matrix based on connections between one or more blocks of the executable graphical model located between the selected one or more input and output points; and calculating the closed loop Jacobian matrix by performing a linear fractional transformation on the open loop Jacobian matrix and the connection matrix.

4. The method of claim 1, further comprising:

selecting an implicit solver, when simulating the executable graphical model over the plurality of time points;

obtaining the matrices of partial derivatives using the selected implicit solver, when simulating the executable graphical model over the plurality of time points.

5. The method of claim 1, further comprising:

determining whether a time domain response for the executable graphical model has changed by at least a threshold amount at a particular one of the plurality of time points during the simulation; and selecting the particular one of the plurality of time points as one of the particular time points at which the matrices of partial derivatives are calculated, when the determining indicates that the time domain response for the executable graphical model has changed by at least the threshold amount.

6. The method of claim 5, wherein determining that the time domain response for the executable graphical model has changed by at least a threshold amount includes at least one of:

determining that a solver, associated with the simulating, has exceeded an error tolerance, detecting a reset associated with the solver, detecting a failure associated with an integration step during the simulating, determining that the solver has increased a step size during the simulating, detecting a user-defined event associated with the solver, detecting a user-defined event associated with a variable of the executable graphical model.

7. The method of claim 1, wherein selecting the one or more input and output points, in an executable graphical model in a modeling system, includes at least one of:

receiving a selection of an input point or an output point in the executable graphical model via a user selection of a particular point in the executable graphical model;

determining an input point or an output point in the executable graphical model based on an open loop Jacobian matrix associated with the executable graphical model; or determining an input point or an output point in the executable graphical model based on a connection to a bidomain simulator block, included in the executable graphical model and associated with the bidomain simulator user interface.

8. The method of claim 1, further comprising:

receiving a selection of a point, or a set of points, on the time domain response plot; and providing an indication, in the bidomain simulator user interface, of a line, or a set of lines, on the frequency domain response plot corresponding to the selected point, or the set of points.

9. The method of claim 1, further comprising:
receiving a selection of a line, or a set of lines, on the frequency domain response plot; and
providing an indication, in the bidomain simulator user interface, of a point, or a set of points, on the time domain response plot corresponding to the selected line, or the set of lines.

10. The method of claim 1, further comprising:
annotating the bidomain simulator user interface to indicate that a particular point on the time domain response plot corresponds to a particular line on the frequency domain response plot.

11. The method of claim 10, wherein a type of the frequency domain response plot includes:
a Bode plot;
a Root Locus plot;
a Pole-zero plot;
a Nyquist plot; or
a Nichols plot.

12. The method of claim 1, further comprising:
providing, in the bidomain simulator user interface, an option to select a type of frequency domain response plot from a plurality of frequency domain response plots;
receiving a selection of the type of frequency domain response plot from the plurality of frequency domain response plots; and
providing the frequency domain response plot as the selected type of frequency domain response plot.

13. The method of claim 1, further comprising:
providing, in the bidomain simulator user interface, an option to include a trigger condition in the frequency domain response plot;
receiving a request to include a trigger condition in the frequency domain response plot;
receiving a selection of an action to perform in response the trigger condition being activated;
detecting, during the simulation, that the trigger condition has been activated; and
performing the action, when the trigger condition is activated.

14. The method of claim 1, wherein the executable graphical model includes a bidomain simulator block, and wherein the bidomain simulator block corresponds to a dual terminal scope block.

15. The method of claim 14, further comprising
providing an option, via the bidomain simulator block, to select a signal associated with the frequency domain response plot to use as a source signal in the executable graphical model;
receiving a selection of the signal associated with the frequency domain response plot to use as a source signal in the executable graphical model;
receiving a selection of a point in the executable graphical model receive the source signal; and
generating a connection in the executable graphic model from the bidomain simulator block to the selected point to provide the selected signal from the bidomain simulator block to the selected point in the executable graphical model.

16. The method of claim 15, wherein the source signal includes one or more of:
an indication that a particular threshold frequency has been exceeded;
a minimum frequency;
a maximum frequency;
a gain margin;
a phase margin;
a damping ratio; or
a natural frequency.

17. A non-transitory computer-readable medium storing instructions executable by one or more processors, the non-transitory computer-readable medium comprising:
one or more instructions to store executable instructions to implement an executable graphical model of a dynamic system, wherein the executable graphical model includes one or more input and output points;
one or more instructions to select the one or more input and output points in the executable graphical model;
one or more instructions to simulate the executable graphical model over a plurality of time points,
one or more instructions to generate a time domain response plot for the executable graphical model based on the simulation,
one or more instructions to obtain matrices of partial derivatives based on the selected one or more input and output points at particular time points of the plurality of time points, wherein the matrices of partial derivatives include a first matrix of partial derivatives of a derivative function with respect to state variables, a second matrix of partial derivatives of the derivative function with respect to inputs, a third matrix of partial derivatives of an output function with respect to the state variables, and a fourth matrix of partial derivatives of the output function with respect to the inputs;
one or more instructions to generate a frequency domain response plot for the executable graphical model based on the obtained matrices of partial derivatives; and
one or more instructions to generate a bidomain simulator user interface that includes the generated time domain response plot and the generated frequency domain response plot.

18. The non-transitory computer-readable medium of claim 17, further comprising:
one or more instructions to obtain a closed loop Jacobian matrix based on the obtained matrices of partial derivatives; and
wherein the one or more instructions to generate a frequency domain response plot for the executable graphical model based on the obtained matrices of partial derivatives include:
one or more instructions to generate a frequency domain response plot for the executable graphical model based on the obtained closed loop Jacobian matrix.

19. The non-transitory computer-readable medium 18, wherein the one or more instructions to obtain a closed loop Jacobian matrix based on the obtained matrices of partial derivatives include:
one or more instructions to determine an open loop Jacobian matrix based on the obtained matrices of partial derivatives;
one or more instructions to determine a connection matrix based on connections between one or more blocks of the executable graphical model located between the selected one or more input and output points; and
one or more instructions to calculate the at least one closed loop Jacobian matrix by performing a linear fractional transformation on the open loop Jacobian matrix and the connection matrix.

20. The non-transitory computer-readable medium of claim 17, further comprising:
one or more instructions to select an implicit solver, when simulating the executable graphical model over the plurality of time points;

one or more instructions to obtain the matrices of partial derivatives using the selected implicit solver, when simulating the executable graphical model over the plurality of time points.

21. The non-transitory computer-readable medium of claim 17, further comprising:

one or more instructions to determine whether a time domain response for the executable graphical model has changed by at least a threshold amount at a particular one of the plurality of time points during the simulation; and one or more instructions to select the particular one of the plurality of time points as one of the particular time points at which the matrices of partial derivatives are calculated, when the time domain response for the executable graphical model has changed by at least the threshold amount.

22. The non-transitory computer-readable medium of claim 21, wherein the one or more instructions to determine whether a time domain response for the executable graphical model has changed by at least a threshold amount at a particular one of the plurality of time points during the simulation include at least one of:

one or more instructions to determine that a solver, associated with the simulating, has exceeded an error tolerance, one or more instructions to detect a reset associated with the solver, one or more instructions to detect a failure associated with integration step during the simulating, one or more instructions to determine that the solver has increased a step size during the simulating, one or more instructions to detect a user-defined event associated with the solver, or one or more instructions to detect a user-defined event associated with a variable of the executable graphical model.

23. The non-transitory computer-readable medium of claim 17, wherein the one or more instructions to select the one or more input and output points in the executable graphical model include at least one of:

one or more instructions to receive a selection of an input point or an output point in the executable graphical model via a user selection of a particular point in the executable graphical model;

one or more instructions to determine an input point or an output point in the executable graphical model based on an open loop Jacobian matrix associated with the executable graphical model; or one or more instructions to determine an input point or an output point in the executable graphical model based on a connection to a bidomain simulator block, included in the executable graphical model and associated with the bidomain simulator user interface.

24. The non-transitory computer-readable medium of claim 17, further comprising: one or more instructions to receive a selection of a point, or a set of points, on the time domain response plot; and one or more instructions to provide an indication, in the bidomain simulator user interface, of a line, or a set of lines, on the frequency domain response plot corresponding to the selected point, or the set of points.

25. The non-transitory computer-readable medium of claim 17, further comprising:

one or more instructions to receive a selection of a line, or a set of lines, on the frequency domain response plot; and one or more instructions to provide an indication, in the bidomain simulator user interface, of a point, or a set of points, on the time domain response plot corresponding to the selected line, or the set of lines.

26. The non-transitory computer-readable medium of claim 17, further comprising:

one or more instructions to annotate the bidomain simulator user interface to indicate that a particular point on the time domain response plot corresponds to a particular line on the frequency dc a response plot.

27. The non-transitory computer-readable medium of claim 26, wherein a type of the frequency domain response plot includes:

a Bode plot;

a Root Locus plot;

a Pole-zero plot;

a Nyquist plot; or a Nichols plot.

28. The non-transitory computer-readable medium of claim 17, further comprising:

one or more instructions to provide, in the bidomain simulator user interface, an option to select a type of frequency domain response plot from a plurality of frequency domain response plots;

one or more instructions to receive a selection of the type of frequency domain response plot from the plurality of frequency domain response plots; and one or more instructions to provide the frequency domain response plot as the selected type of frequency domain response plot.

29. The non-transitory computer-readable medium of claim 17, further comprising:

one or more instructions to provide, in the bidomain simulator user interface, an option to include a trigger condition in the frequency domain response plot;

one or more instructions to receive a request to include a trigger condition in the frequency domain response plot;

one or more instructions to receive a selection of an action to perform in response the trigger condition being activated;

one or more instructions to detect, during the simulation, that the trigger condition has been activated; and one or more instructions to perform the action, when that the trigger condition is been activated.

30. The non-transitory computer-readable medium of claim 17, wherein the executable graphical model includes a bidomain simulator block, and wherein the bidomain simulator block corresponds to a dual terminal scope block.

31. The non-transitory computer-readable medium of claim 30, further comprising:

one or more instructions to provide an option, via the bidomain simulator block, to select a signal associated with the frequency domain response plot to use as a source signal in the executable graphical model;

one or more instructions to receive a selection of the signal associated with the frequency domain response plot to use as a source signal in the executable graphical model;

one or more instructions to receive a selection of a point in the executable graphical model to receive the source signal; and one or more instructions to generate a connection in the executable graphic model from the bidomain simulator block to the selected point to provide the selected signal from the bidomain simulator block to the selected point in the executable graphical model.

32. The non-transitory computer-readable medium of claim 30, wherein the source signal includes one or more of:

an indication that a particular threshold frequency has been exceeded;
a minimum frequency;
a maximum frequency;
a gain margin;
a phase margin;
a damping ratio; or
a natural frequency.

33. A computing device comprising:
a memory to store executable instructions to implement an executable graphical model of a dynamic system, wherein the executable graphical model includes one or more input and output points; and
a processor to:
select the one or more input and output points in the executable graphical model,
simulate the executable graphical model over a plurality of time points,
generate a time domain response plot for the executable graphical model based on the simulation,
obtain at least one closed loop Jacobian matrix based on the selected one or more input and output points at particular time points of the plurality of time points,
generate a frequency domain response plot for the executable graphical model based on the at least one closed loop Jacobian matrix, and
generate a bidomain simulator user interface that includes the generated time domain response plot and the generated frequency don response plot.

* * * * *